US012812900B2

(12) United States Patent
Kachi

(10) Patent No.: US 12,812,900 B2
(45) Date of Patent: Nov. 24, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Tsuyoshi Kachi, Kanazawa Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 640 days.

(21) Appl. No.: 18/450,774

(22) Filed: Aug. 16, 2023

(65) Prior Publication Data

US 2024/0313110 A1 Sep. 19, 2024

(30) Foreign Application Priority Data

Mar. 15, 2023 (JP) ................................ 2023-040747

(51) Int. Cl.

*H10D 30/66* (2025.01)
*H10D 64/00* (2025.01)
*H10D 64/23* (2025.01)

(52) U.S. Cl.

CPC ......... *H10D 30/668* (2025.01); *H10D 64/117* (2025.01); *H10D 64/256* (2025.01)

(58) Field of Classification Search

None
See application file for complete search history.

(56) References Cited

U.S. PATENT DOCUMENTS 9,947,770 B2 4/2018 Li et al.
9,954,095 B2 4/2018 Moriya et al.
2007/0166925 A1 7/2007 Takeda et al.
(Continued)

FOREIGN PATENT DOCUMENTS

JP H05-315620 A 11/1993
JP 2002-026321 A 1/2002
(Continued)

OTHER PUBLICATIONS

Notice of Reasons for Refusal (Office Action) mailed Feb. 16, 2026, in corresponding Japanese Patent Application No. 2023-040747, with English machine translation, 11 pages.

*Primary Examiner* — Nilufa Rahim
(74) *Attorney, Agent, or Firm* — Kim & Stewart LLP

(57) ABSTRACT

A semiconductor device includes a first electrode, a semiconductor part located on the first electrode, an insulating film located on the semiconductor part, a second electrode located on the insulating film, a third electrode located on the insulating film, an insulating body located in the semiconductor part, a first conductive member located in the semiconductor part with the insulating body interposed, a second conductive member located in the insulating body, and a third conductive member located in the semiconductor part. The first conductive member is connected to the third electrode. The second conductive member is connected to the second electrode. The third conductive member extends in a first direction from a region directly under the second electrode to at least a region directly under the third electrode. The third conductive member is connected to the semiconductor part and the second electrode.

12 Claims, 24 Drawing Sheets

(56) References Cited

U.S. PATENT DOCUMENTS

| | | | | |
|---|---|---|---|---|
| 2020/0295180 | A1* | 9/2020 | Ichinoseki ........... | H10D 30/668 |
| 2021/0057574 | A1 | 2/2021 | Nishiwaki et al. | |
| 2024/0030339 | A1* | 1/2024 | Shibib .................. | H10D 30/665 |
| 2024/0105835 | A1* | 3/2024 | Shinoda ............... | H10D 30/668 |

FOREIGN PATENT DOCUMENTS

| | | | |
|---|---|---|---|
| JP | 2007-201391 | A | 8/2007 |
| JP | 2010-534921 | A | 11/2010 |
| JP | 2017-163107 | A | 9/2017 |
| JP | 2020150200 | A | 9/2020 |
| JP | 2021034540 | A | 3/2021 |
| WO | 2022264694 | A1 | 12/2022 |

* cited by examiner

SEMICONDUCTOR DEVICE

CROSS-REFERENCE TO RELATED APPLICATIONS

This application is based upon and claims the benefit of priority from Japanese Patent Application No. 2023-040747, filed on Mar. 15, 2023; the entire contents of which are incorporated herein by reference.

FIELD

Embodiments relate to a semiconductor device.

BACKGROUND

In a trench-gate power control semiconductor device, a field plate electrode may be provided in the gate trench to relax concentration of the electric flux, thereby decreasing the electric field in the device. In such a semiconductor device, it is necessary to provide independent parts to draw out the gate electrode to the chip upper surface and to draw out the field plate electrode to the chip upper surface at the termination part of the gate trench. An ineffective region that cannot contribute to the power control is increased thereby, and the on-resistance is undesirably increased.

DETAILED DESCRIPTION

Figure 1A:
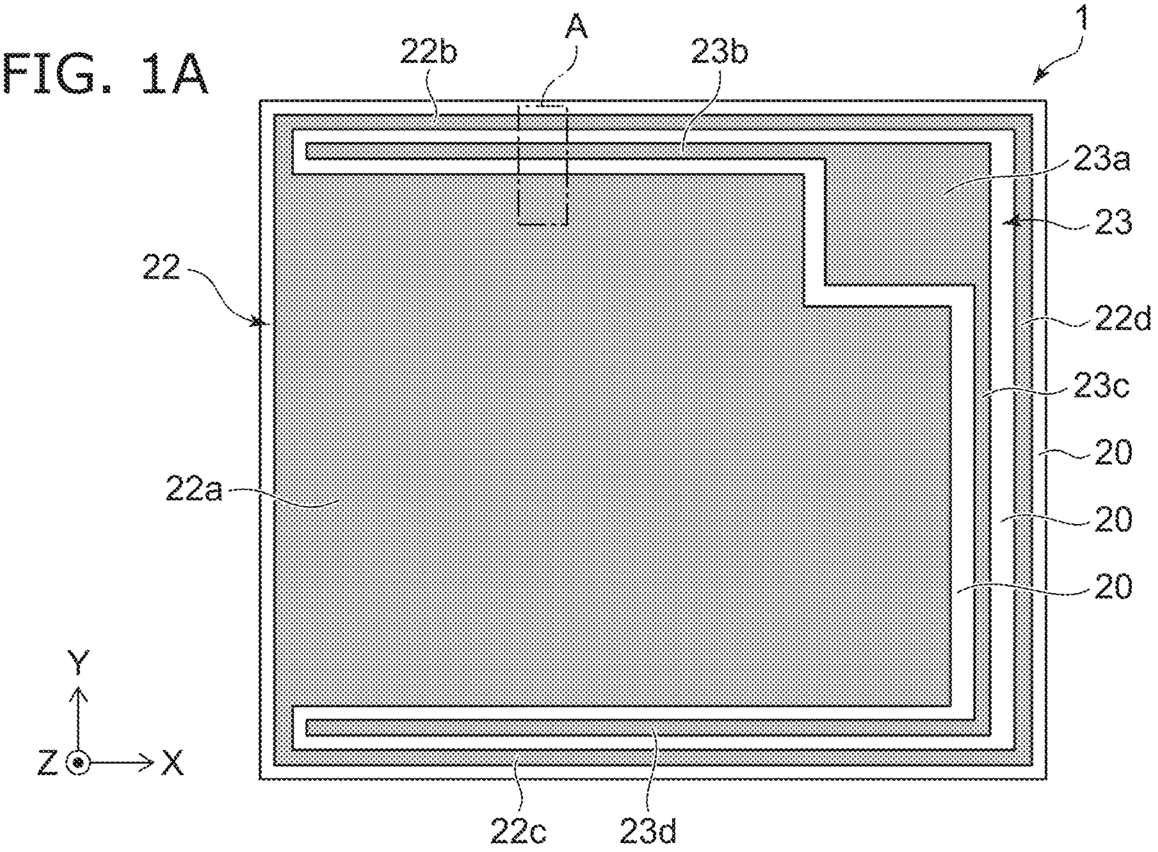
FIG. 1A is a top view showing a semiconductor device according to a first embodiment.

A semiconductor device according to an embodiment includes a first electrode, a semiconductor part located on the first electrode, an insulating film located on the semiconductor part, a second electrode located on the insulating film, a third electrode located on the insulating film, an insulating body located in the semiconductor part, a first conductive member located in the semiconductor part with the insulating body interposed, a second conductive member located in the insulating body, and a third conductive member located in the semiconductor part. The insulating body extends in a first direction. The first conductive member extends in the first direction. The first conductive member is connected to the third electrode. The second conductive member extends in the first direction. The second conductive member is connected to the second electrode. The third conductive member extends in the first direction from a region directly under the second electrode to at least a region directly under the third electrode. The third conductive member is connected to the semiconductor part and the second electrode.

A semiconductor device according to an embodiment includes a first electrode, a semiconductor part located on the first electrode, an insulating film located on the semiconductor part, a second electrode located on the insulating film, a third electrode located on the insulating film, an insulating body located in the semiconductor part, a first conductive member located in the insulating body, a second conductive member located in the insulating body, and a third conductive member located in the semiconductor part. The second electrode includes a first part and a second part. At least a portion of the third electrode is located between the first part and the second part. The insulating body extends in a first direction. The first direction is from the first part toward the second part. The first conductive member extends in the first direction. The first conductive member is connected to the third electrode. The second conductive member extends in the first direction. The second conductive member is connected to the second part. The third conductive member extends in the first direction. The third conductive member is connected to the semiconductor part and the first part.

A semiconductor device according to an embodiment includes a first electrode, a semiconductor part located on the first electrode, an insulating film located on the semiconductor part, a second electrode located on the insulating film, a plurality of insulating bodies located in the semiconductor part, first conductive members located respectively in the plurality of insulating bodies, second conductive members located respectively in the plurality of insulating bodies, a third conductive member located between two adjacent insulating bodies among the plurality of insulating bodies in the semiconductor part, and a first wiring part located in the insulating film. The second conductive members are connected to the second electrode. The third conductive member is connected to the semiconductor part and the second electrode. The first wiring part is connected to two of the first conductive members located in two adjacent insulating bodies among the plurality of insulating bodies.

First Embodiment

First, a first embodiment will be described.

Figure 1B:
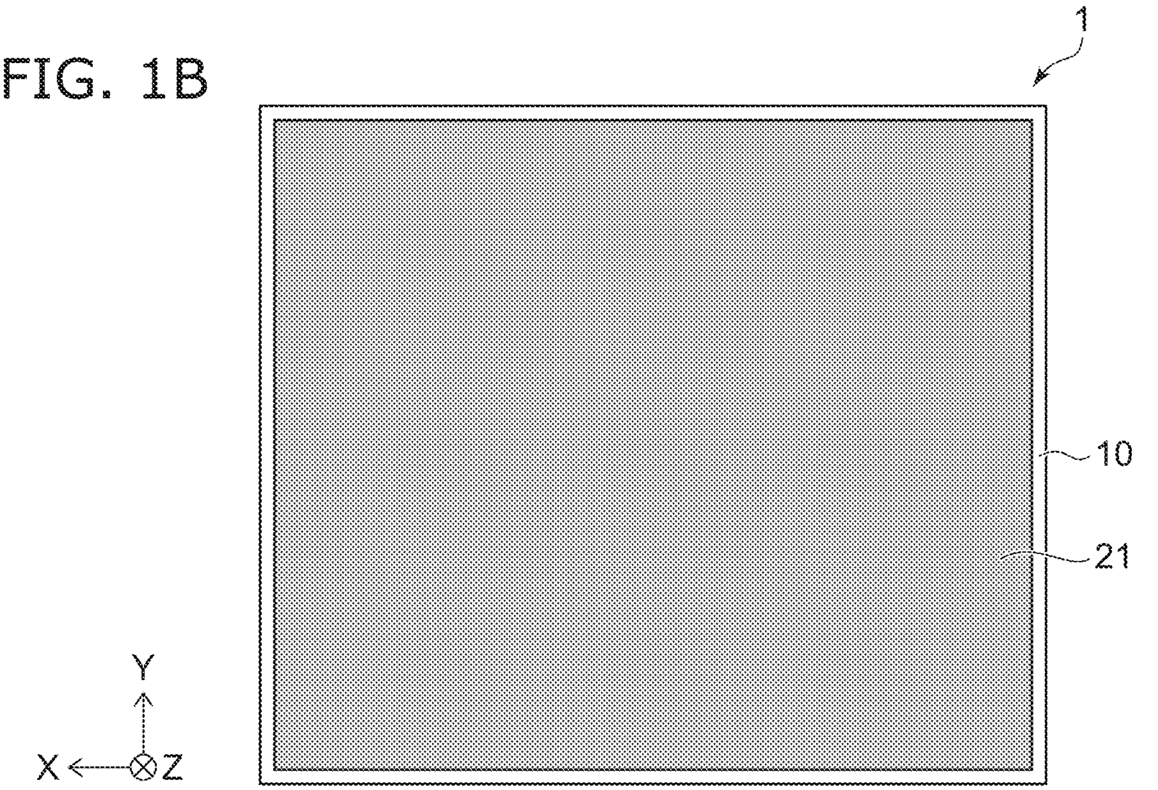
FIG. 1B is a bottom view of the semiconductor device according to the first embodiment.

FIG. 1A is a top view showing a semiconductor device according to the embodiment; and FIG. 1B is a bottom view of the semiconductor device according to the embodiment.

Figure 2:
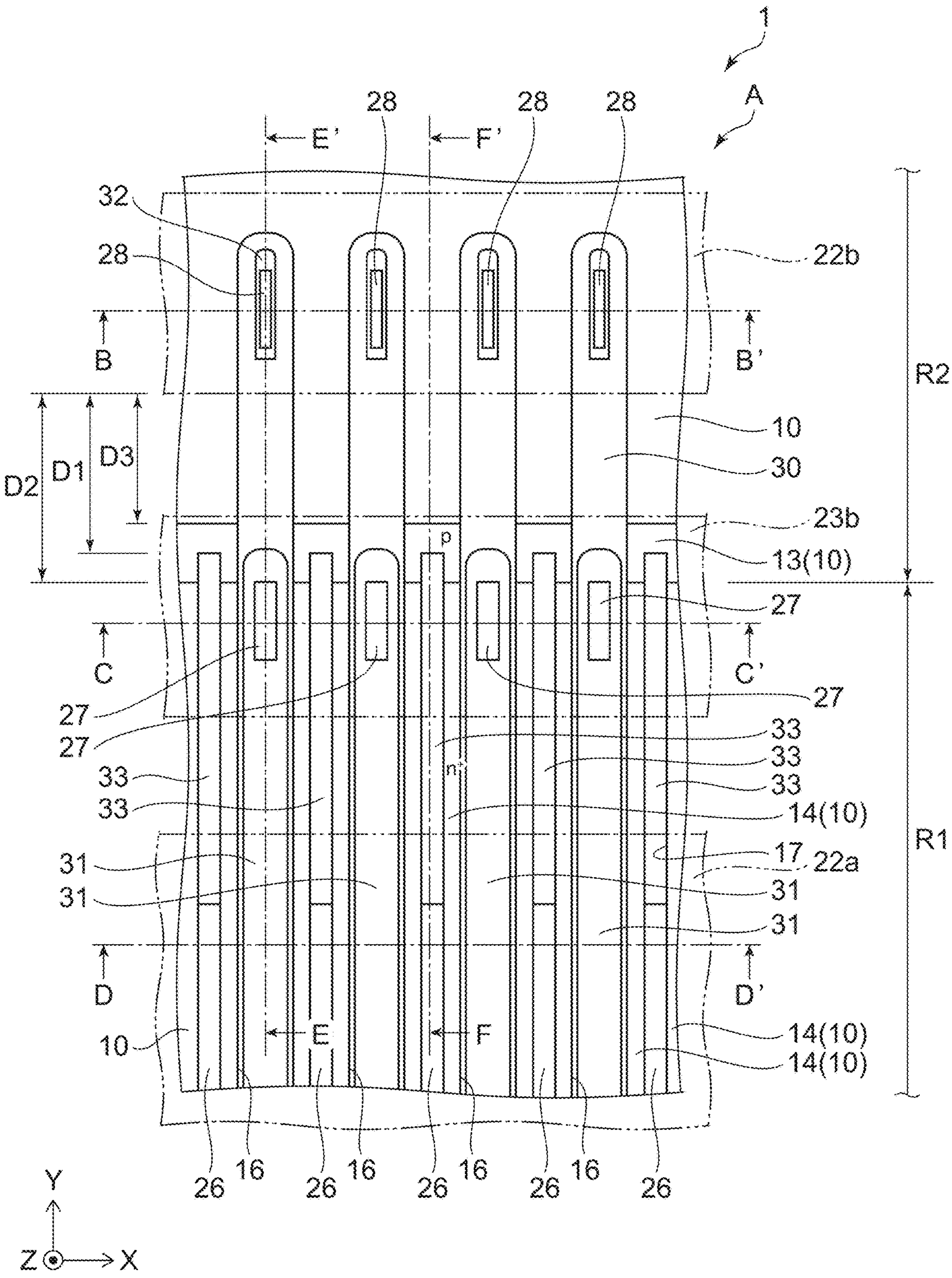
FIG. 2 is a partially enlarged top view showing region A of FIG. 1A.

FIG. 2 is a partially enlarged top view showing region A of FIG. 1A.

Figure 3:
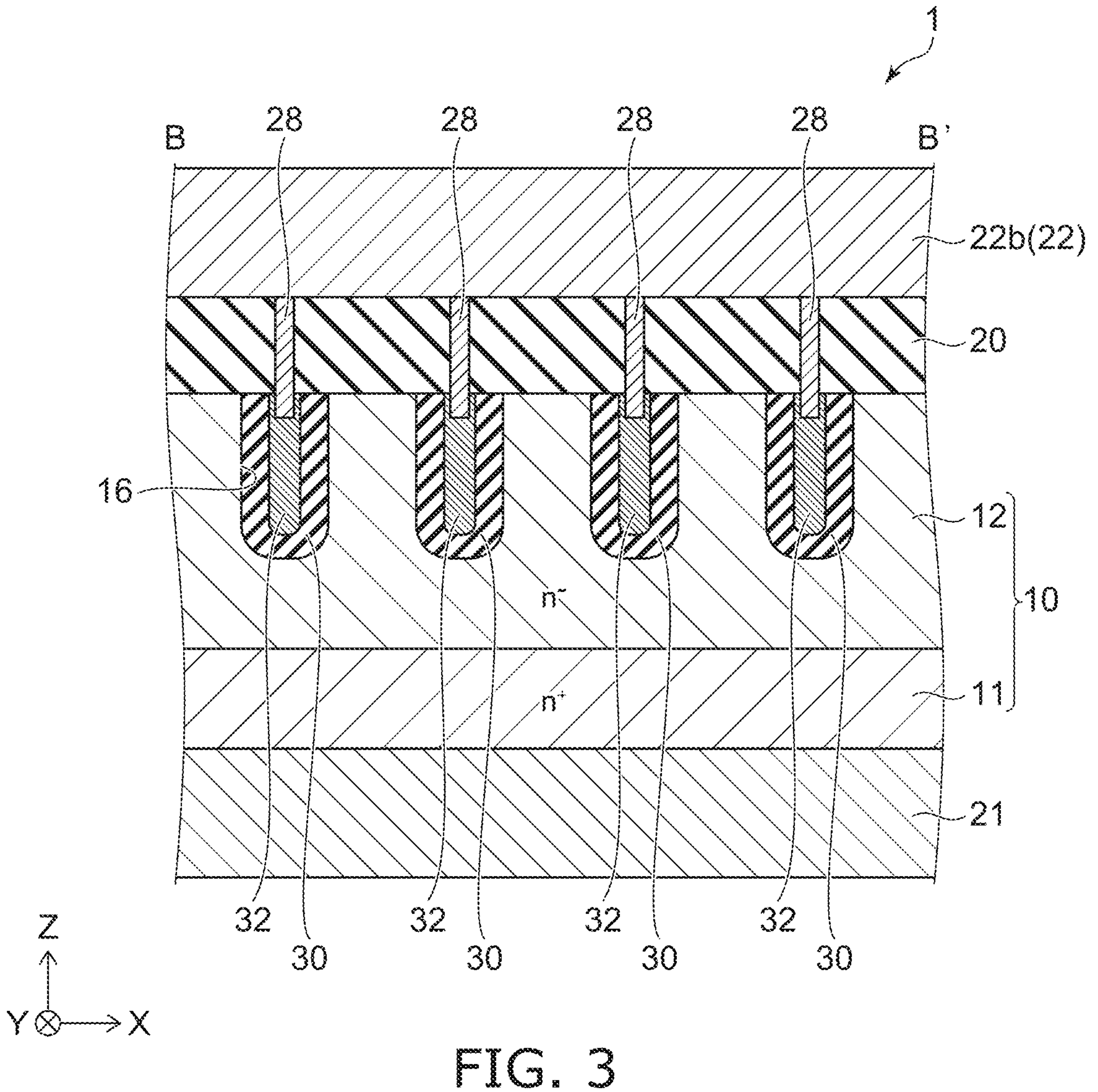
FIG. 3 is a cross-sectional view along line B-B' shown in FIG. 2.

FIG. 3 is a cross-sectional view along line B-B' shown in FIG. 2.

Figure 4:
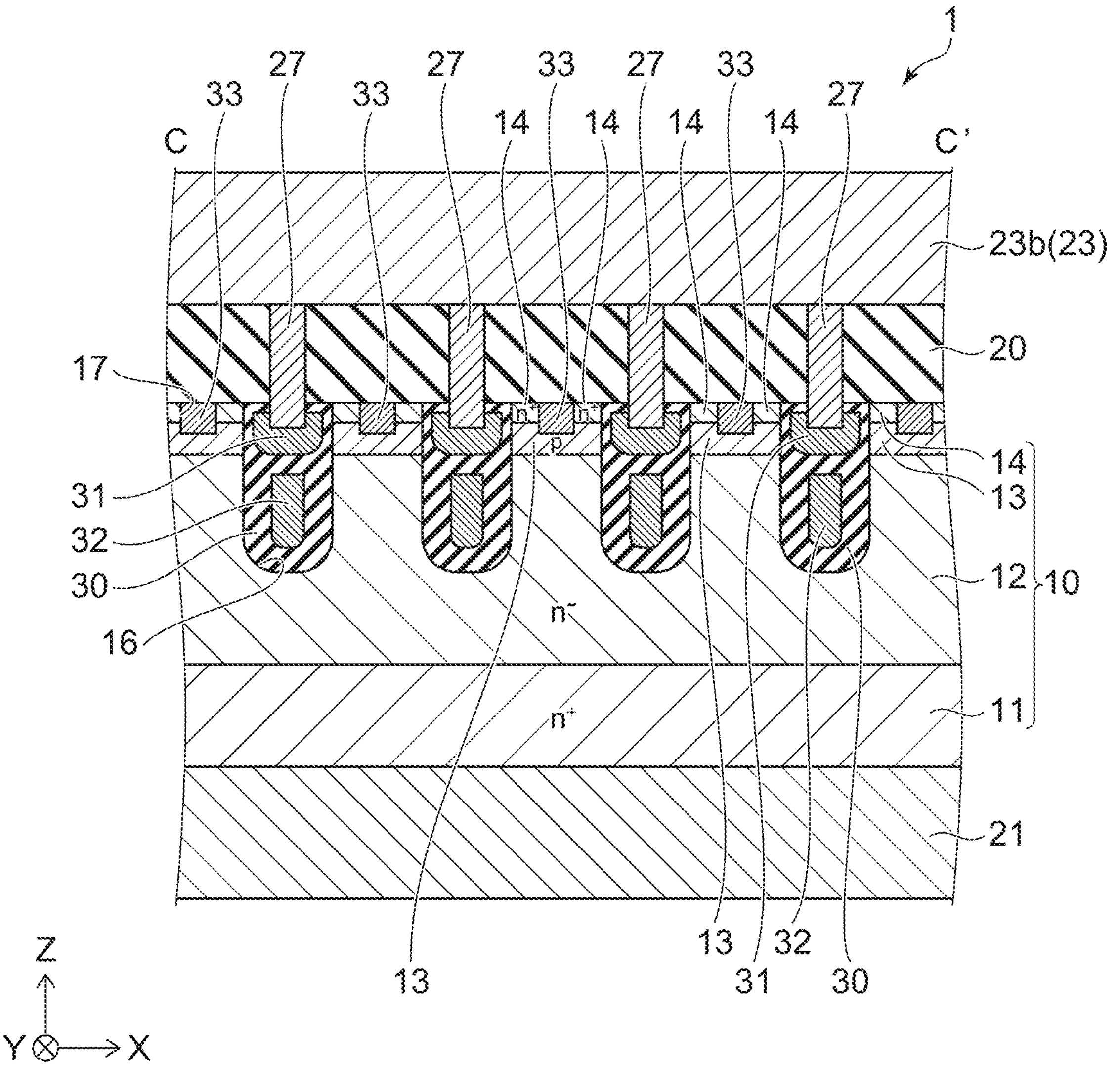
FIG. 4 is a cross-sectional view along line C-C' shown in FIG. 2.

FIG. 4 is a cross-sectional view along line C-C' shown in FIG. 2.

Figure 5:
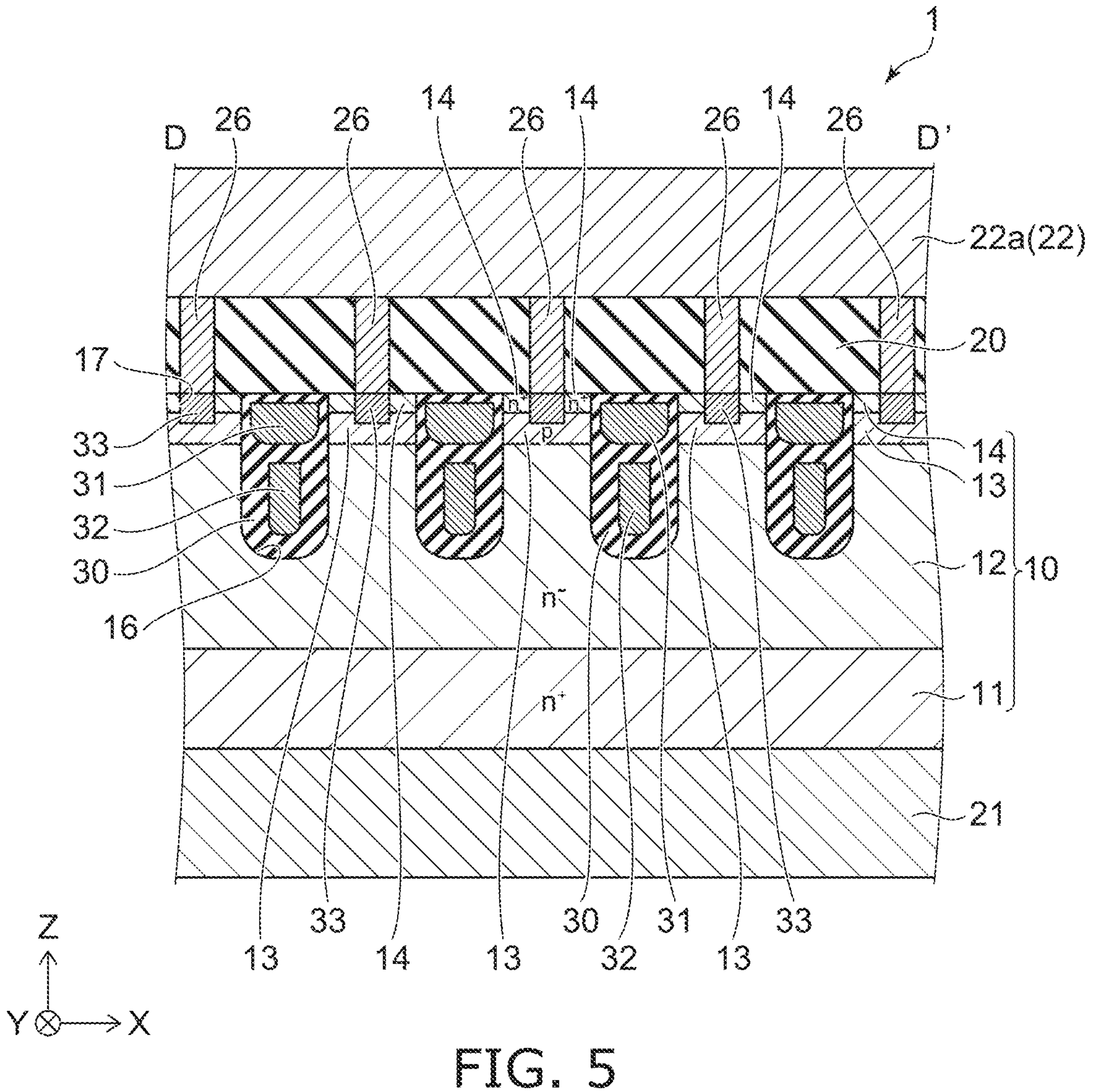
FIG. 5 is a cross-sectional view along line D-D' shown in FIG. 2.

FIG. 5 is a cross-sectional view along line D-D' shown in FIG. 2.

Figure 6:
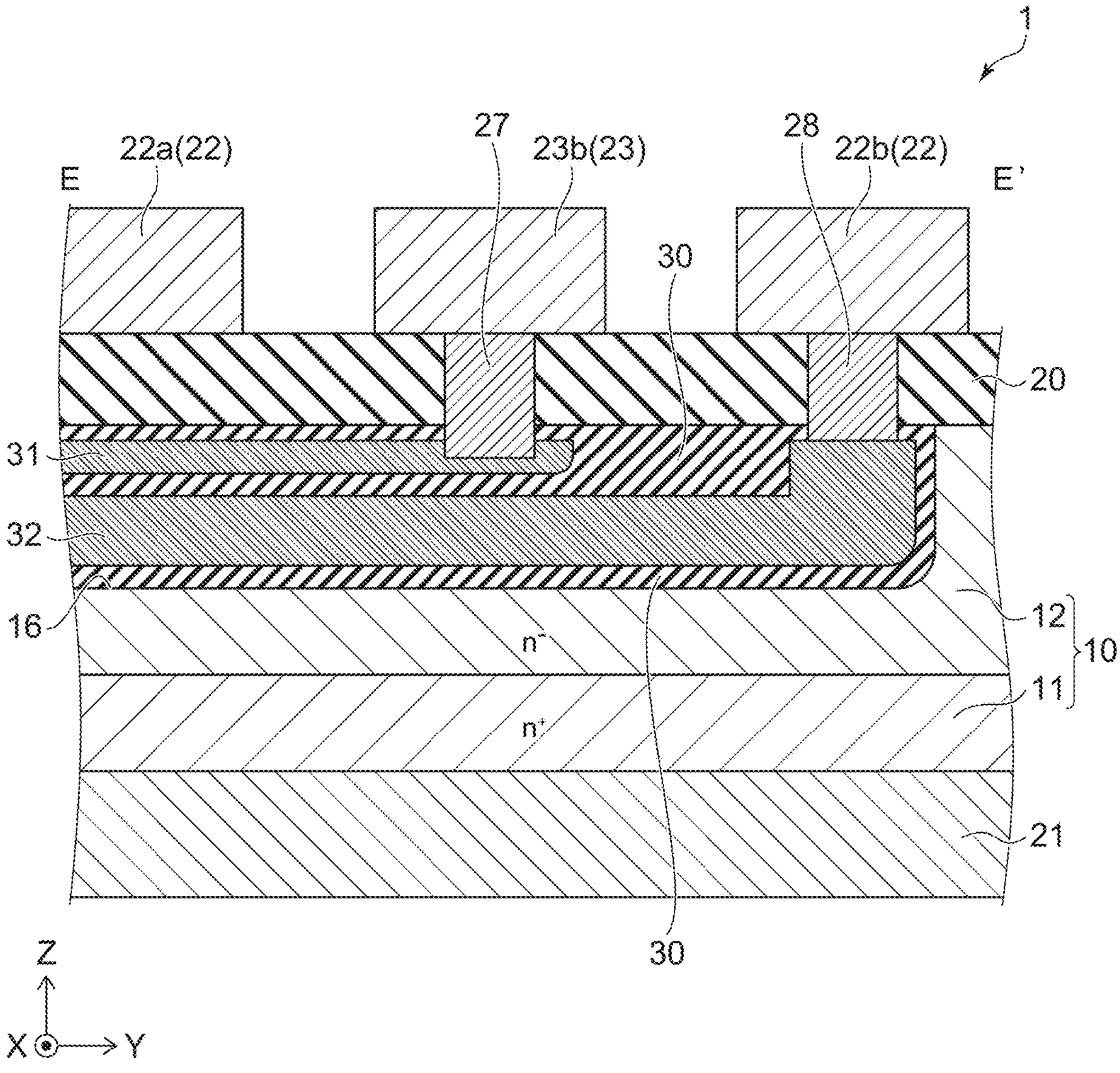
FIG. 6 is a cross-sectional view along line E-E' shown in FIG. 2.

FIG. 6 is a cross-sectional view along line E-E' shown in FIG. 2.

Figure 7:
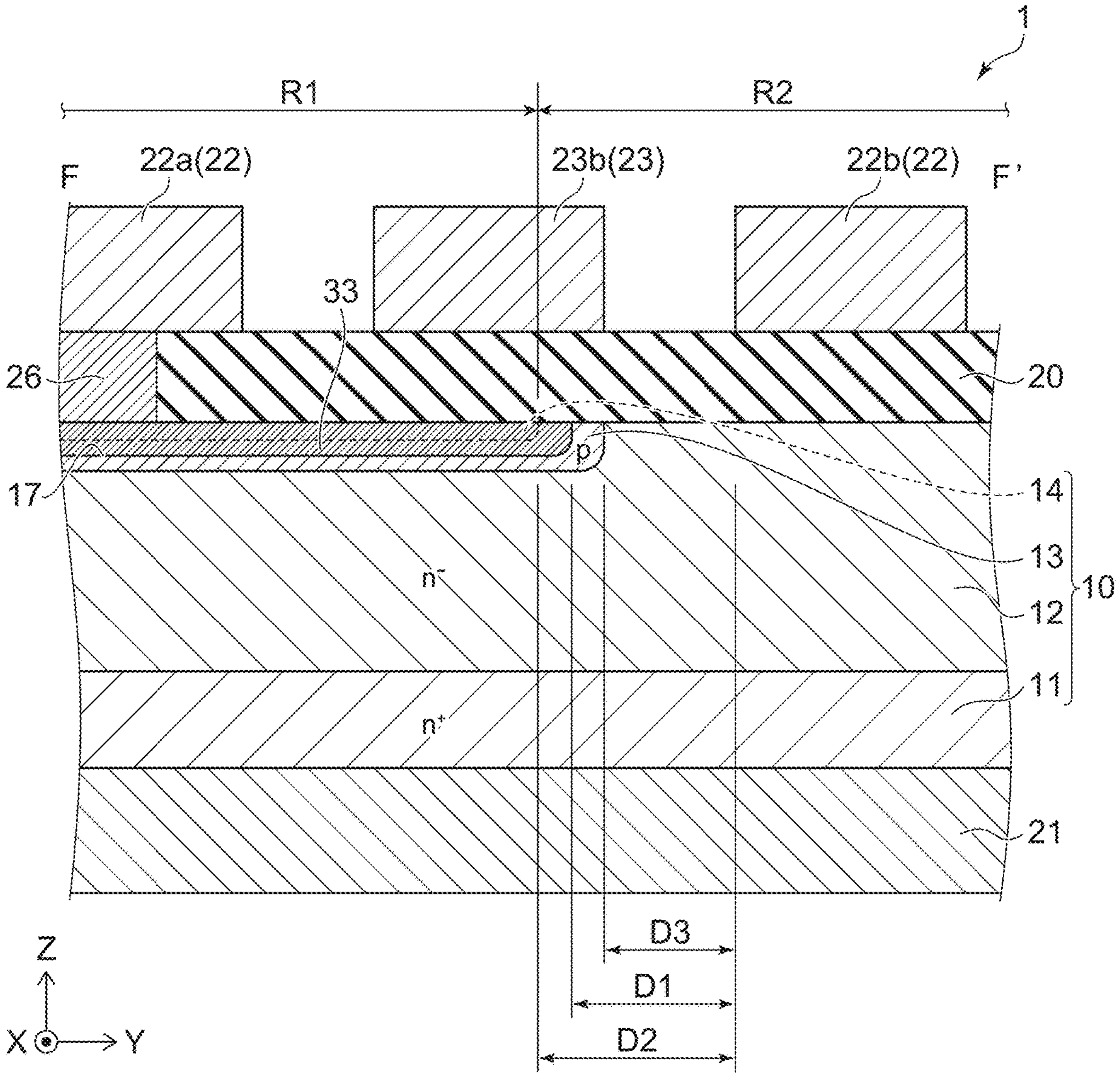
FIG. 7 is a cross-sectional view along line F-F' shown in FIG. 2.

FIG. 7 is a cross-sectional view along line F-F' shown in FIG. 2.

The semiconductor device according to the embodiment is a vertical semiconductor device for power control and is, for example, a MOSFET (Metal-Oxide-Semiconductor Field-Effect Transistor). The semiconductor device according to the embodiment may be an IGBT (Insulated Gate Bipolar Transistor). An example of a MOSFET is described in the embodiment.

As shown in FIGS. 1A and 1B, the semiconductor device 1 according to the embodiment has, for example, a rectangular plate shape. The semiconductor device 1 includes a semiconductor part 10. The semiconductor part 10 includes a semiconductor material and includes, for example, silicon (Si) and impurities. A drain electrode 21 (a first electrode) is located on substantially the entire lower surface of the semiconductor part 10. An insulating film 20 is located on the semiconductor part 10.

A source electrode 22 (a second electrode) and a gate electrode 23 (a third electrode) are provided to be separated from each other on the insulating film 20. The drain electrode 21, the source electrode 22, and the gate electrode 23 are made of conductive materials and include, for example, aluminum (Al). The insulating film 20 is made of an insulating material and includes, for example, silicon oxide ($SiO_x$). The drain electrode 21, the source electrode 22, and the gate electrode 23 are illustrated in gray in FIGS. 1A and 1B for convenience of illustration. In FIG. 2, the insulating film 20 is not illustrated, and the source electrode 22 and the gate electrode 23 are illustrated by double dot-dash lines.

The source electrode 22 includes a pad part 22*a* (a first part) located in a region other than the termination part of the semiconductor device 1, a wiring part 22*b* (a second part) located along the termination part of the semiconductor device 1, a wiring part 22*c*, and a wiring part 22*d*. The gate electrode 23 includes a pad part 23*a* located at one corner portion of the semiconductor device 1, a wiring part 23*b*, a wiring part 23*c*, and a wiring part 23*d*.

An XYZ orthogonal coordinate system is employed for convenience of description in the specification hereinbelow. The thickness direction of the semiconductor device 1 is taken as a "Z-direction"; and two directions in which edges of the semiconductor device 1 extend are taken as an "X-direction" and a "Y-direction". Among the Z-directions, the direction from the drain electrode 21 toward the source electrode 22 is called the "+Z direction", and the opposite direction is called the "−Z direction". The +Z direction also is called "up", and the −Z direction also is called "down", but these expressions are for convenience and are independent of the direction of gravity. One of the X-directions is called the "+X direction", and the opposite direction is called the "−X direction". Similarly, one of the Y-directions is called the "+Y direction", and the opposite direction is called the "−Y direction". In the coordinates of the drawings, "+X direction", "+Y direction", and "+Z direction" are respectively labeled as simply "X", "Y", and "Z". According to the embodiment, the pad part 23*a* of the gate electrode 23 is located at a corner portion at the +X/+Y direction side of the semiconductor device 1.

The shape of the pad part 22*a* of the source electrode 22 is substantially rectangular when viewed from the +Z direction. However, a recess corresponding to the pad part 23*a* of the gate electrode 23 is provided in the rectangle at the corner portion at the +X/+Y direction side of the pad part 22*a*. The wiring part 22*b* of the source electrode 22 extends in the +Y direction from the corner portion at the −X/+Y direction side of the pad part 22*a* and then extends in the +X direction along the edge at the +Y direction side of the semiconductor device 1. The direction from the pad part 22*a* toward the wiring part 22*b* of the source electrode 22 is the +Y direction.

The wiring part 22*c* extends in the −Y direction from the corner portion at the −X/−Y direction side of the pad part 22*a* and then extends in the +X direction along the edge at the −Y direction side of the semiconductor device 1. The wiring part 22*d* connects between the end portion at the +X direction side of the wiring part 22*b* and the end portion at the +X direction side of the wiring part 22*c* and extends in the Y-direction along the edge at the +X direction side of the semiconductor device 1. The pad part 22*a* and the wiring parts 22*b* to 22*d* of the source electrode 22 are configured into a closed loop; and the gate electrode 23 is located inside the loop. The wiring part 22*d* may not be provided, and the source electrode 22 may be open at the +X direction side.

The wiring part 23*b* of the gate electrode 23 extends in the −X direction from the corner portion at the −X/+Y direction side of the pad part 23*a*. The wiring part 23*b* is located between the pad part 22*a* and the wiring part 22*b* of the source electrode 22. The wiring part 23*c* extends in the −Y direction from the corner portion at the +X/−Y direction side of the pad part 23*a*. The wiring part 23*c* is located between the pad part 22*a* and the wiring part 22*d* of the source electrode 22. The wiring part 23*d* extends in the −X direction from the end portion at the −Y direction side of the wiring part 23*c*. The wiring part 23*d* is located between the pad part 22*a* and the wiring part 22*c* of the source electrode 22.

As shown in FIGS. 2 to 7, multiple gate trenches 16 and multiple source trenches 17 are formed in the semiconductor part 10 from the upper surface side. The gate trench 16 is deeper than the source trench 17. The gate trench 16 and the source trench 17 extend in the Y-direction and are alternately arranged along the X-direction. The gate trench 16 and the source trench 17 do not extend through the semiconductor part 10 in the Z-direction, and do not extend through the semiconductor part 10 in the Y-direction.

Insulating bodies 30 are provided respectively in the gate trenches 16. Accordingly, the insulating body 30 is located in the semiconductor part 10; and the upper surface of the insulating body 30 is exposed at the upper surface of the semiconductor part 10. In the specification, the expression "component A being located in component B" includes both the case where the component A is completely covered with the component B and the case where the component A is located inside the component B but a portion of a surface of the component A is exposed at a surface of the component B. The insulating body 30 extends in the Y-direction. The insulating body 30 includes, for example, silicon oxide.

One trench gate electrode 31 (a first conductive member) and one field plate electrode 32 (a second conductive member, called the "FP electrode 32" hereinbelow) are provided in each insulating body 30. The trench gate electrode 31 and the FP electrode 32 extend in the Y-direction. The trench gate electrode 31 is located above the FP electrode 32 in the insulating body 30. In other words, the FP electrode 32 is positioned between the drain electrode 21 and the trench gate electrode 31. The trench gate electrode 31 and the FP electrode 32 are made of a conductive material and are made of, for example, polysilicon including an impurity.

Trench source electrodes 33 (third conductive members) are provided respectively in the source trenches 17. Accordingly, the trench source electrode 33 is located in the semiconductor part 10; and the upper surface of the trench source electrode 33 is exposed at the upper surface of the semiconductor part 10. In the Y-direction, the position of the end portion of the trench source electrode 33 is substantially the same as the position of the end portion of the trench gate electrode 31. In other words, when viewed along the Z-direction, a distance D1 between the trench source electrode 33 and the wiring part 22*b* of the source electrode 22 is substantially equal to the distance between the trench gate electrode 31 and the wiring part 22*b* of the source electrode 22.

The upper surface of the trench source electrode 33 is positioned higher than the upper surface of the trench gate electrode 31; and the lower surface of the trench source electrode 33 is positioned lower than the upper surface of the trench gate electrode 31 and higher than the lower surface of the trench gate electrode 31. The trench gate electrode 31 is made of a conductive material, includes, for example, a metal, and is, for example, a three-layer film in which a titanium layer (Ti), a titanium nitride layer (TiN), and a tungsten layer (W) are stacked in this order.

Multiple source contacts 26 (first contacts), multiple gate contacts 27 (second contacts), and multiple FP contacts 28 (third contacts) are provided in the insulating film 20. The source contact 26, the gate contact 27, and the FP contact 28 extend in the Y-direction. The source contact 26 is longer than the gate contact 27 and the FP contact 28 in the Y-direction. The gate contact 27 is positioned between the source contact 26 and the FP contact 28 in the Y-direction. The source contact 26, the gate contact 27, and the FP contact 28 are made of conductive materials and include, for example, tungsten.

The source contacts 26 are located in a region directly under the pad part 22*a* of the source electrode 22. The multiple source contacts 26 are arranged in one column along the X-direction. The lower ends of the source contacts 26 are connected respectively to the trench source electrodes 33; and the upper ends of the source contacts 26 are connected to the pad part 22*a* of the source electrode 22. The trench source electrodes 33 are thereby connected to the pad part 22*a* of the source electrode 22 via the source contacts 26. In the specification, "connected" means an electrical connection.

The gate contacts 27 are located in a region directly under the wiring part 23*b* and a region directly under the wiring part 23*d* of the gate electrode 23. The multiple gate contacts 27 are arranged in one column along the X-direction in the region directly under the wiring part 23*b*. Other multiple gate contacts 27 are arranged in one column along the X-direction in the region directly under the wiring part 23*d*. Only the gate contacts 27 located in the region directly under the wiring part 23*b* are shown in FIG. 2.

The lower ends of the gate contacts 27 located in the region directly under the wiring part 23*b* of the gate electrode 23 are connected to the end portions at the +Y direction side of the trench gate electrodes 31; and the upper ends of the gate contacts 27 are connected to the wiring part 23*b*. The lower ends of the gate contacts 27 located in the region directly under the wiring part 23*d* of the gate electrode 23 are connected to the end portions at the −Y direction side of the trench gate electrodes 31; and the upper ends of the gate contacts 27 are connected to the wiring part 23*d*. The trench gate electrodes 31 are thereby connected to the gate electrode 23 via the gate contacts 27.

The FP contacts 28 are located in a region directly under the wiring part 22*b* and a region directly under the wiring part 22*c* of the source electrode 22. The multiple FP contacts 28 are arranged in one column along the X-direction in the region directly under the wiring part 22*b*. Other multiple FP contacts 28 are arranged in one column along the X-direction in the region directly under the wiring part 22*c*. Only the FP contacts 28 located in the region directly under the wiring part 22*b* are shown in FIG. 2.

The lower ends of the FP contacts 28 located in the region directly under the wiring part 22*b* of the source electrode 22 are connected to the end portions at the +Y direction side of the FP electrodes 32; and the upper ends of the FP contacts 28 are connected to the wiring part 22*b*. The lower ends of the FP contacts 28 located in the region directly under the wiring part 22*c* of the source electrode 22 are connected to the end portions at the −Y direction side of the FP electrodes 32; and the upper ends of the FP contacts 28 are connected to the wiring part 22*c*. The FP electrodes 32 are thereby connected to the wiring parts 22*b* and 22*c* of the source electrode 22 via the FP contacts 28.

As shown in FIGS. 3 to 7, the semiconductor part 10 includes an $n^+$-type drain layer 11, an $n^-$-type drift layer 12, a p-type base layer 13 (a second layer), and an $n^+$-type source layer 14 (a third layer). The drain layer 11 contacts the drain electrode 21. The drift layer 12 is located on the drain layer 11 and contacts the drain layer 11. A first layer that is connected to the drain electrode 21 includes the drain layer 11 and the drift layer 12.

The base layer 13 is located on a portion of the drift layer 12 and contacts the drift layer 12. As shown in FIGS. 2 and 7, the base layer 13 is located on the drift layer 12 at a part other than the two Y-direction end portions of the drift layer 12, and is not located on the two Y-direction end portions of the drift layer 12. The source layer 14 is located on a portion of the base layer 13 and contacts the base layer 13. As shown in FIGS. 2 and 7, the source layer 14 is located on a part of the base layer 13 other than the two Y-direction end portions of the base layer 13, and is not located on the two Y-direction end portions of the base layer 13.

The trench source electrode 33 contacts the source layer 14 and the base layer 13 and is separated from the drain layer 11 and the drift layer 12 are the base layer 13. The trench source electrode 33 is thereby connected to the source layer 14 and the base layer 13. The source layer 14 and the base layer 13 are thereby connected to the source electrode 22 via the trench source electrode 33 and the source contact 26.

In the Y-direction, the trench source electrode 33 extends through the source layer 14 but does not extend through the base layer 13. Therefore, in the Y-direction, the distance D1 between the trench source electrode 33 and the wiring part 22*b* of the source electrode 22 is less than a distance D2 between the wiring part 22*b* and the source layer 14 and greater than a distance D3 between the wiring part 22*b* and the base layer 13. In other words, D3<D1<D2.

A method for manufacturing the semiconductor device according to the embodiment will now be described.

FIGS. 8A to 8C and FIGS. 9A and 9B are process cross-sectional views showing the method for manufacturing the semiconductor device according to the embodiment.

The drain electrode 21 and the drain layer 11 are not illustrated in FIGS. 8A to 9B.

Figure 8A:
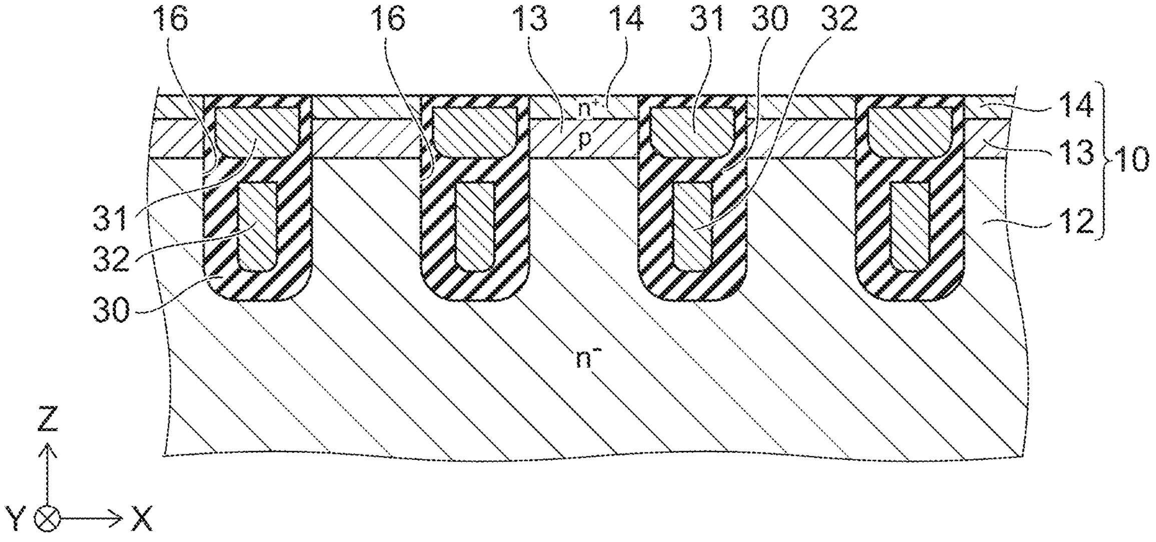
FIGS. 8A to 8C and FIGS. 9A and 9B are process cross-sectional views showing a method for manufacturing the semiconductor device according to the first embodiment.

First, as shown in FIG. 8A, the gate trench 16 is formed in the semiconductor part 10 from the upper surface side. Then, the insulating body 30, the FP electrode 32, and the trench gate electrode 31 are formed in the gate trench 16. Then, the base layer 13 and the source layer 14 are formed by ion-implanting an impurity into the semiconductor part 10 from the upper surface side.

Figure 8B:
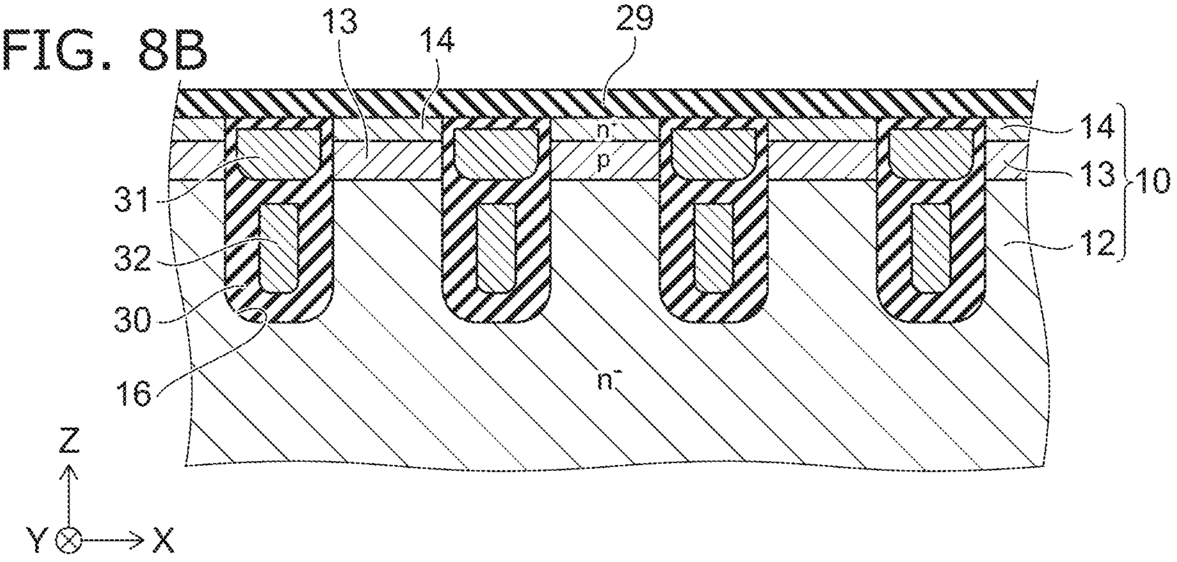

Continuing as shown in FIG. 8B, an insulating film 29 is formed on the semiconductor part 10. For example, the insulating film 29 is formed by depositing silicon oxide.

Figure 8C:
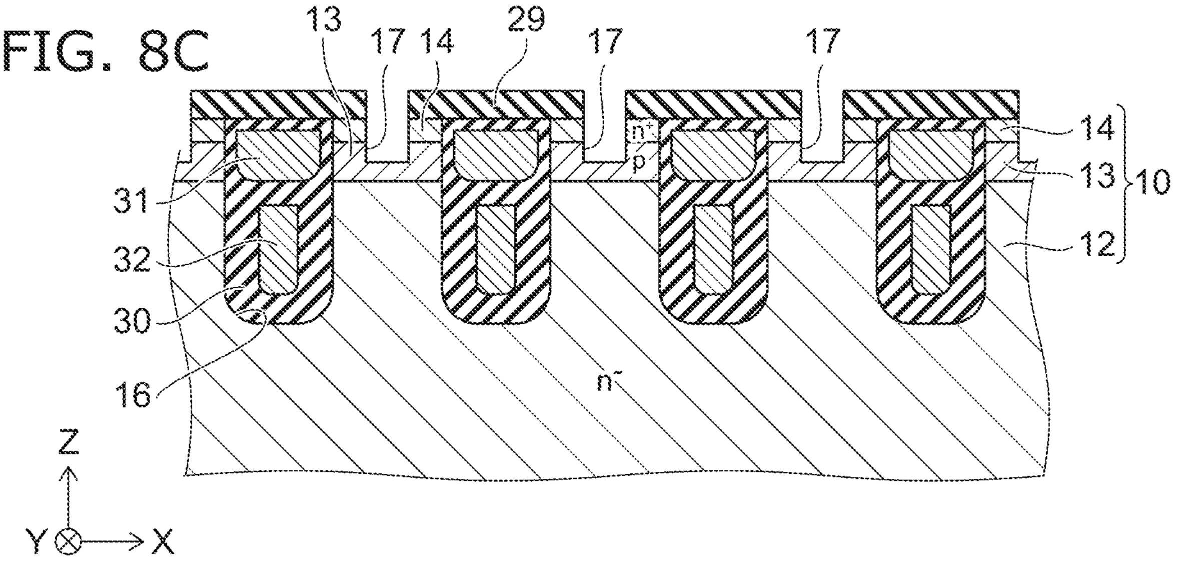

Then, the insulating film 29 is patterned as shown in FIG. 8C. Then, the source trench 17 is formed in a portion of the region of the upper surface of the semiconductor part 10 between the insulating bodies 30 by etching the semiconductor part 10 using the patterned insulating film 29 as a mask. The source trench 17 has a depth that extends through the source layer 14 but does not extend through the base layer 13.

Figure 9A:
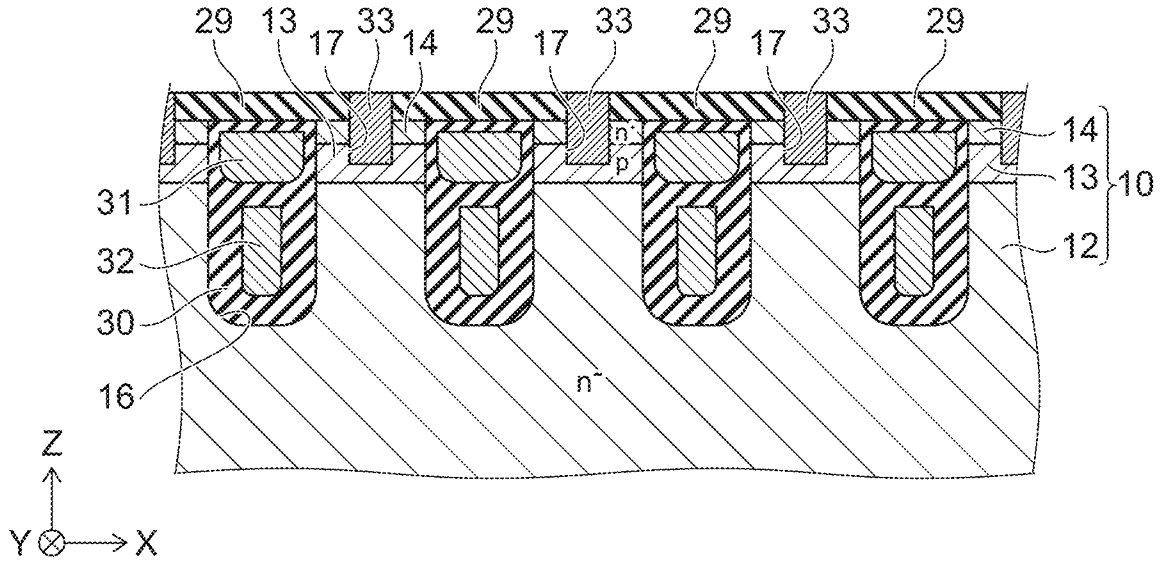

Continuing as shown in FIG. 9A, a conductive film is formed on the semiconductor part 10 and on the insulating film 29. For example, a titanium layer, a titanium nitride layer, and a tungsten layer are formed in this order. Then, for example, the conductive film that is on the insulating film 29 is removed by performing CMP (Chemical Mechanical Polishing) so that the conductive film remains in the source trench 17. Thereby, the trench source electrode 33 is formed in the source trench 17.

Figure 9B:
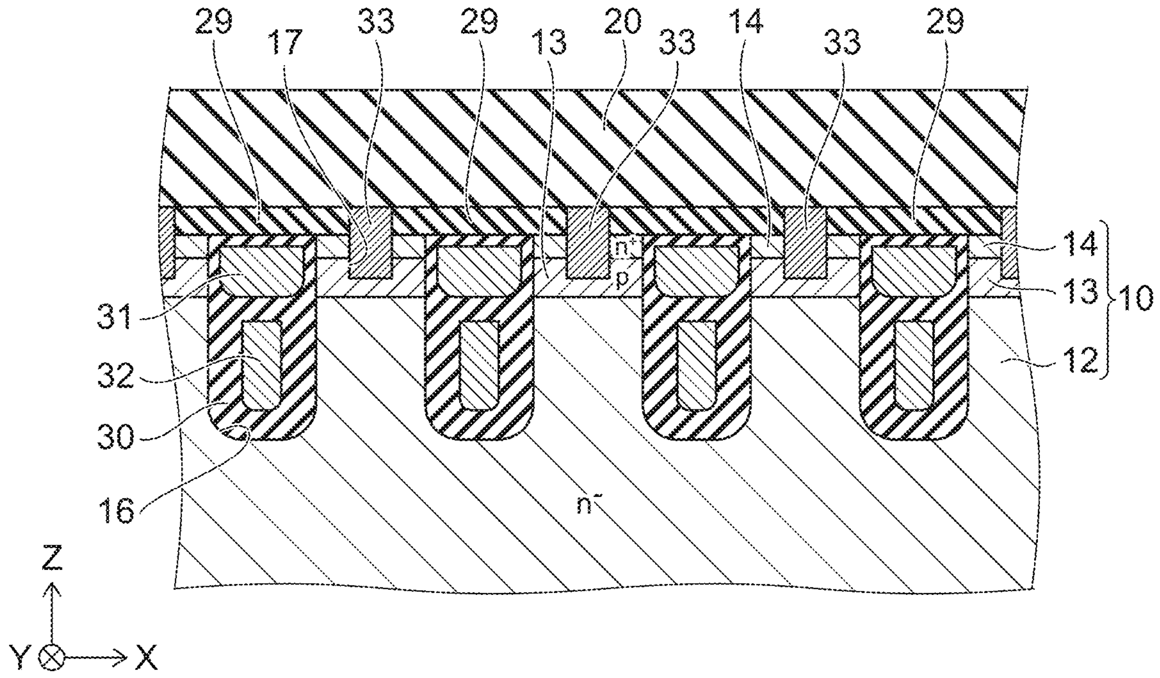

Then, as shown in FIG. 9B, the insulating film 20 is formed on the insulating film 29 and on the trench source electrode 33. For example, the insulating film 20 is formed by depositing silicon oxide by CVD (Chemical Vapor Deposition). Hereinbelow, the insulating film 29 is described as a portion of the insulating film 20.

Continuing as shown in FIGS. 1A to 7, the source contact 26, the gate contact 27, and the FP contact 28 are formed in the insulating film 20. Then, the source electrode 22 and the gate electrode 23 are formed by forming a conductive film on the insulating film 20 and by patterning. The drain electrode 21 is formed on the lower surface of the semiconductor part 10. Thus, the semiconductor device 1 is manufactured.

Effects of the embodiment will now be described.

As shown in FIG. 2, the semiconductor device 1 includes the trench source electrode 33. The trench source electrode 33 is connected to the source layer 14 and the base layer 13. On the other hand, the trench source electrode 33 is connected to the source electrode 22 via the source contact 26. At the termination parts of the semiconductor device 1 at the two Y-direction sides, the trench source electrode 33 is drawn out to the Y-direction side as far as the trench gate electrode 31.

Therefore, even when the source layer 14 is formed to the vicinities of the two Y-direction end portions of the trench gate electrode 31, a prescribed potential can be applied to the entire source layer 14 via the source electrode 22, the source contact 26, and the trench source electrode 33. As a result, an ineffective region R2 that cannot contribute to the power control of the semiconductor device 1 can be reduced, and the effective region R1 that can contribute to the power control of the semiconductor device 1 can be enlarged to the vicinities of the two Y-direction end portions of the trench gate electrode 31. The on-resistance of the semiconductor device 1 can be reduced thereby.

Comparative Example of First Embodiment

A comparative example of a first embodiment will now be described.

Figure 10:
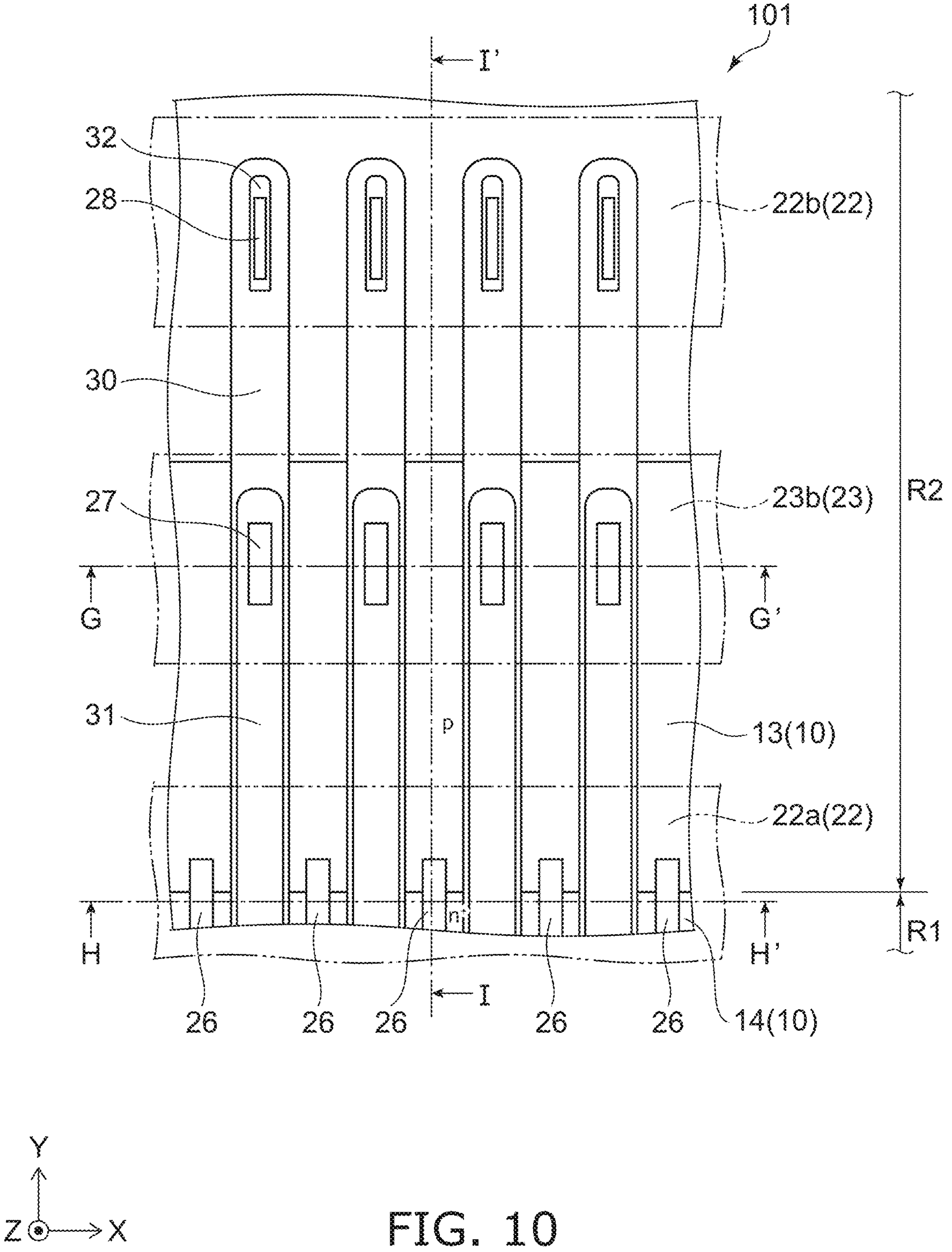
FIG. 10 is a partially enlarged top view showing a semiconductor device according to a comparative example of the first embodiment.

FIG. 10 is a partially enlarged top view showing a semiconductor device according to the comparative example.

Figure 11:
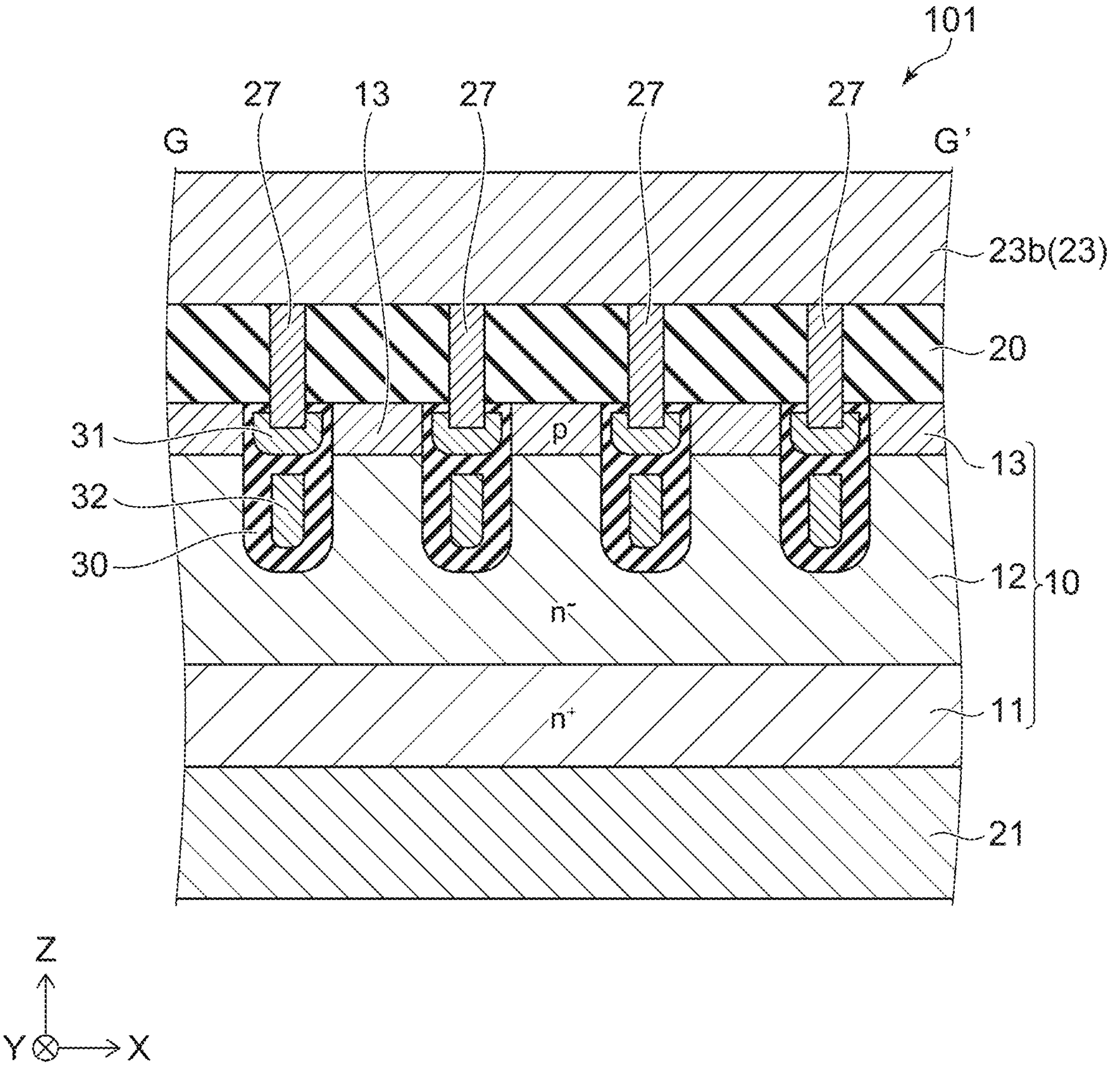
FIG. 11 is a cross-sectional view along line G-G' shown in FIG. 10.

FIG. 11 is a cross-sectional view along line G-G' shown in FIG. 10.

Figure 12:
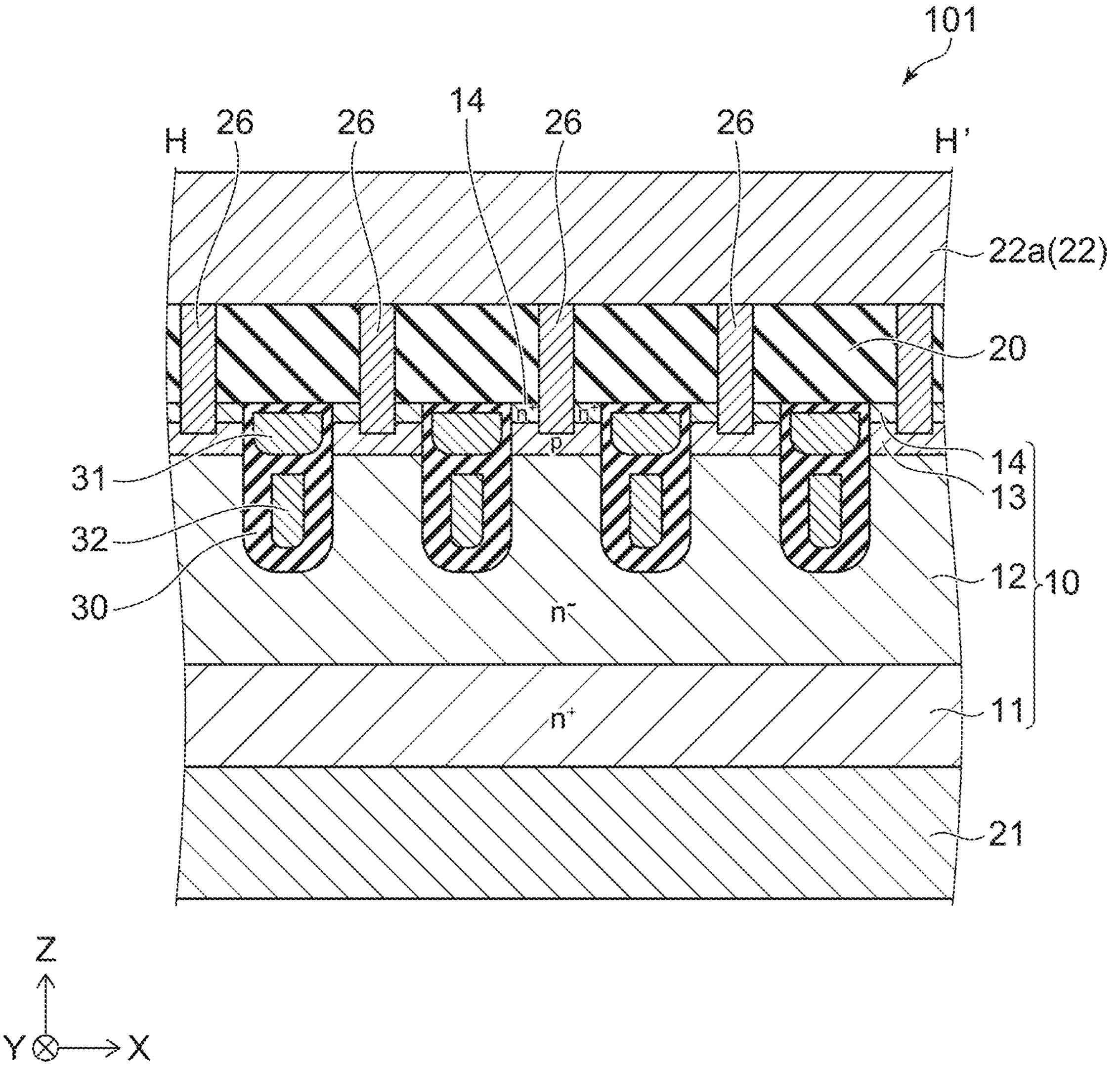
FIG. 12 is a cross-sectional view along line H-H' shown in FIG. 10.

FIG. 12 is a cross-sectional view along line H-H' shown in FIG. 10.

Figure 13:
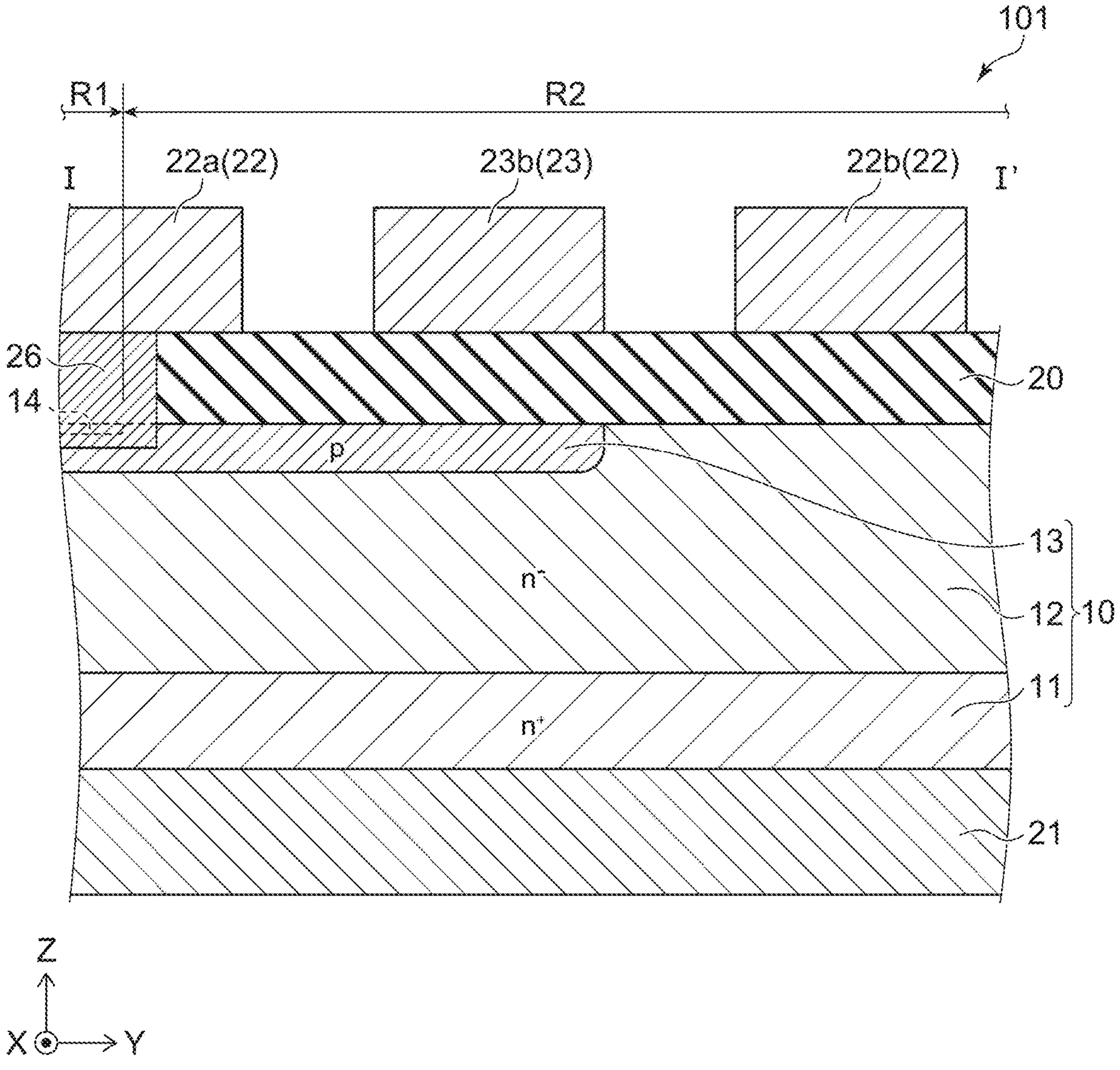
FIG. 13 is a cross-sectional view along line I-I' shown in FIG. 10.

FIG. 13 is a cross-sectional view along line I-I' shown in FIG. 10.

As shown in FIGS. 10 to 13, the semiconductor device 101 according to the comparative example does not include the trench source electrode 33. Therefore, the source layer 14 can be drawn out only to the vicinity of the source contact 26 in the Y-direction; and the vicinities of the two Y-direction end portions of the trench gate electrode 31 are in the ineffective region R2. As a result, the on-resistance of the semiconductor device 101 is high.

If the terminations of the source layer 14 at the Y-direction side are drawn out past the terminations of the source contact 26 at the Y-direction side to the vicinities of the two Y-direction end portions of the trench gate electrode 31, there is a possibility that the potential of the parts of the source layer 14 positioned further toward the termination side than the source contact 26 may not be the prescribed potential due to the resistance of the source layer 14 itself. Accordingly, an unintended parasitic operation may occur, and a malfunction of the semiconductor device 101 may occur.

Test Examples

Test examples will now be described.

Figure 14:
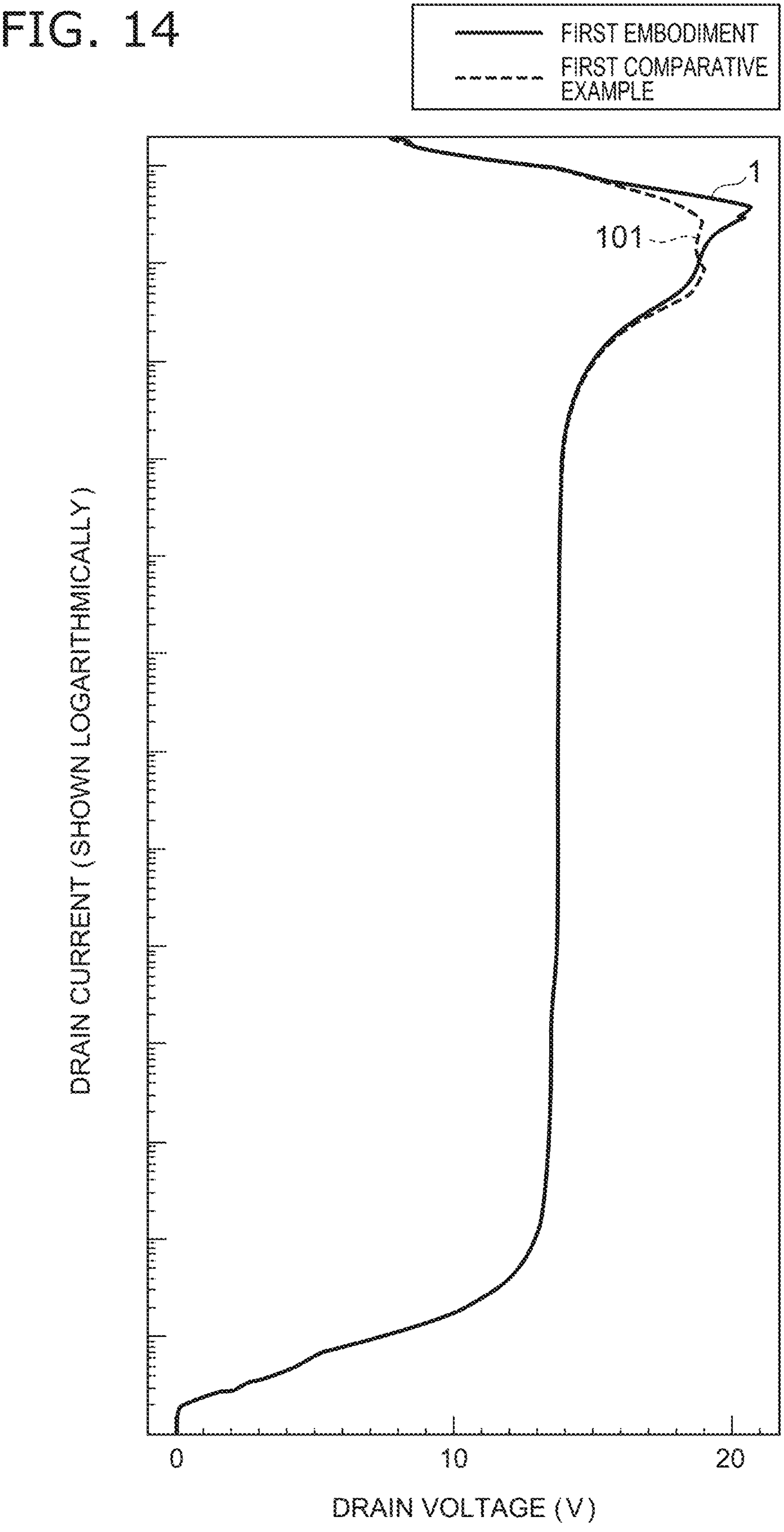
FIG. 14 is a graph showing electrical characteristics of semiconductor devices according to test examples, in which the horizontal axis is a drain voltage, and the vertical axis is a drain current.

FIG. 14 is a graph showing electrical characteristics of semiconductor devices according to the test examples, in which the horizontal axis is the drain voltage, and the vertical axis is the drain current.

In the test examples, for the semiconductor device 1 according to the first embodiment described above and the semiconductor device 101 according to the first comparative example, the drain voltage between the drain electrode 21 and the source electrode 22 was increased from zero in a state in which a potential was applied to the gate electrode 23 to set the semiconductor devices to the on-state; and the drain current that flowed between the drain electrode 21 and the source electrode 22 was measured.

As a result, in the semiconductor device 1 according to the first embodiment as shown in FIG. 14, compared with the semiconductor device 101 according to the first comparative example, the snapback voltage and the snapback current were high, and the avalanche resistance was high. It is considered that this was because the semiconductor device 1 includes the trench source electrode 33; therefore, the effective region R1 is wide, which reduces the on-resistance and relaxes the concentration of the electric flux, thereby decreasing the electric field.

Second Embodiment

A second embodiment will now be described.

Components according to the embodiment having functions similar to those of the components described in the first embodiment are marked with the same names and reference numerals for convenience of description. However, components that are marked with the same names and reference numerals may have different shapes from those of the first embodiment. This is similar for the third embodiment described below as well.

Figure 15:
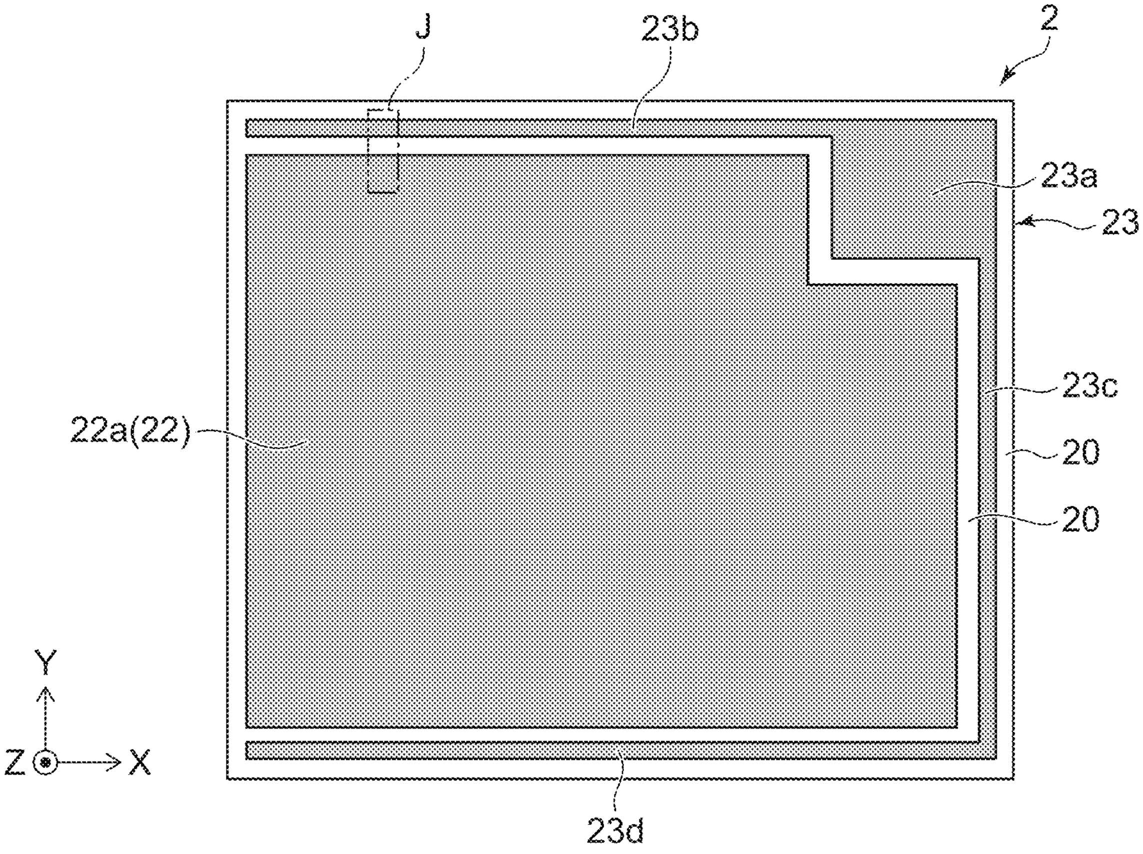
FIG. 15 is a top view showing a semiconductor device according to a second embodiment.

FIG. 15 is a top view showing a semiconductor device according to the embodiment.

Figure 16:
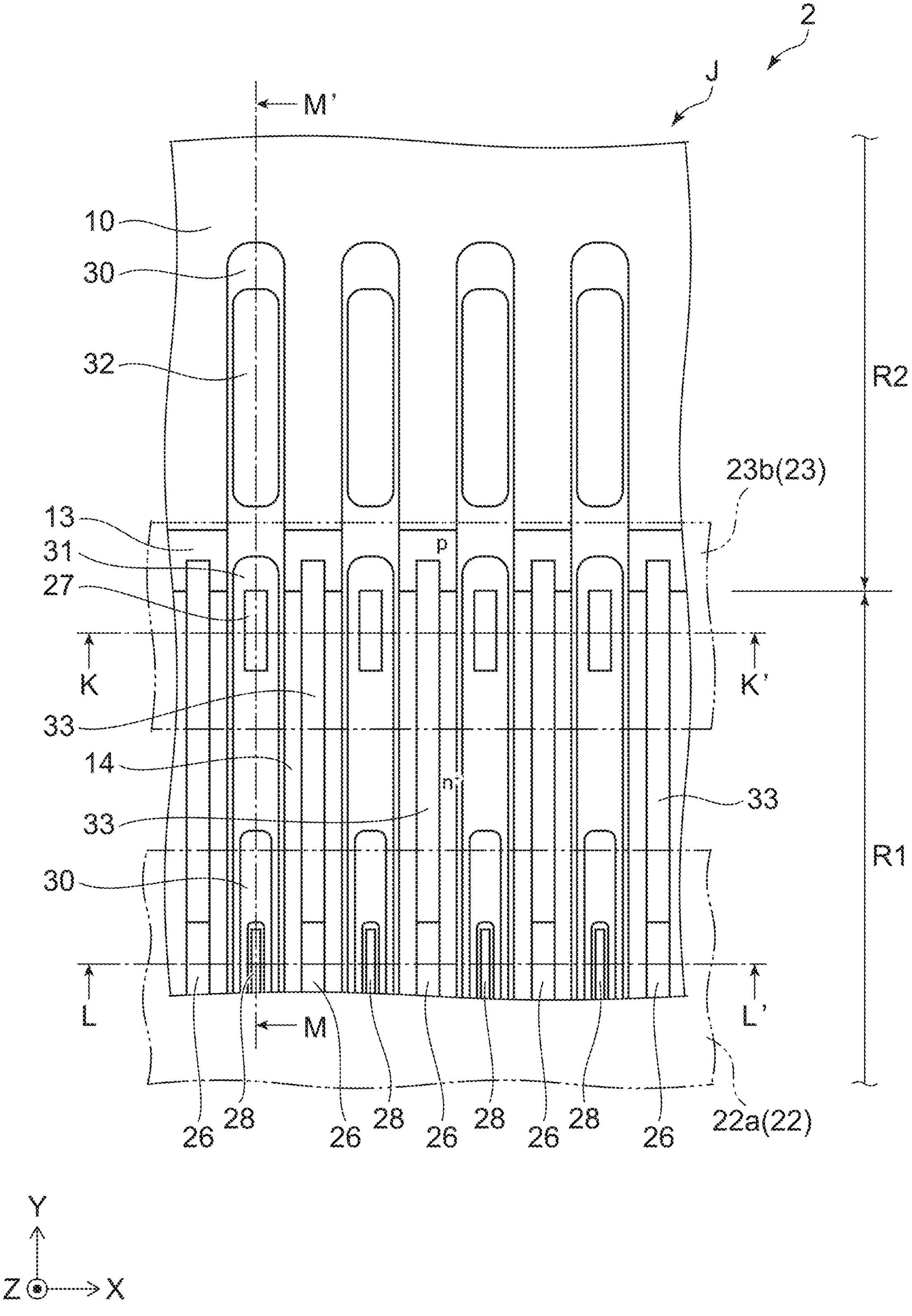
FIG. 16 is a partially enlarged top view showing region J of FIG. 15.

FIG. 16 is a partially enlarged top view showing region J of FIG. 15.

Figure 17:
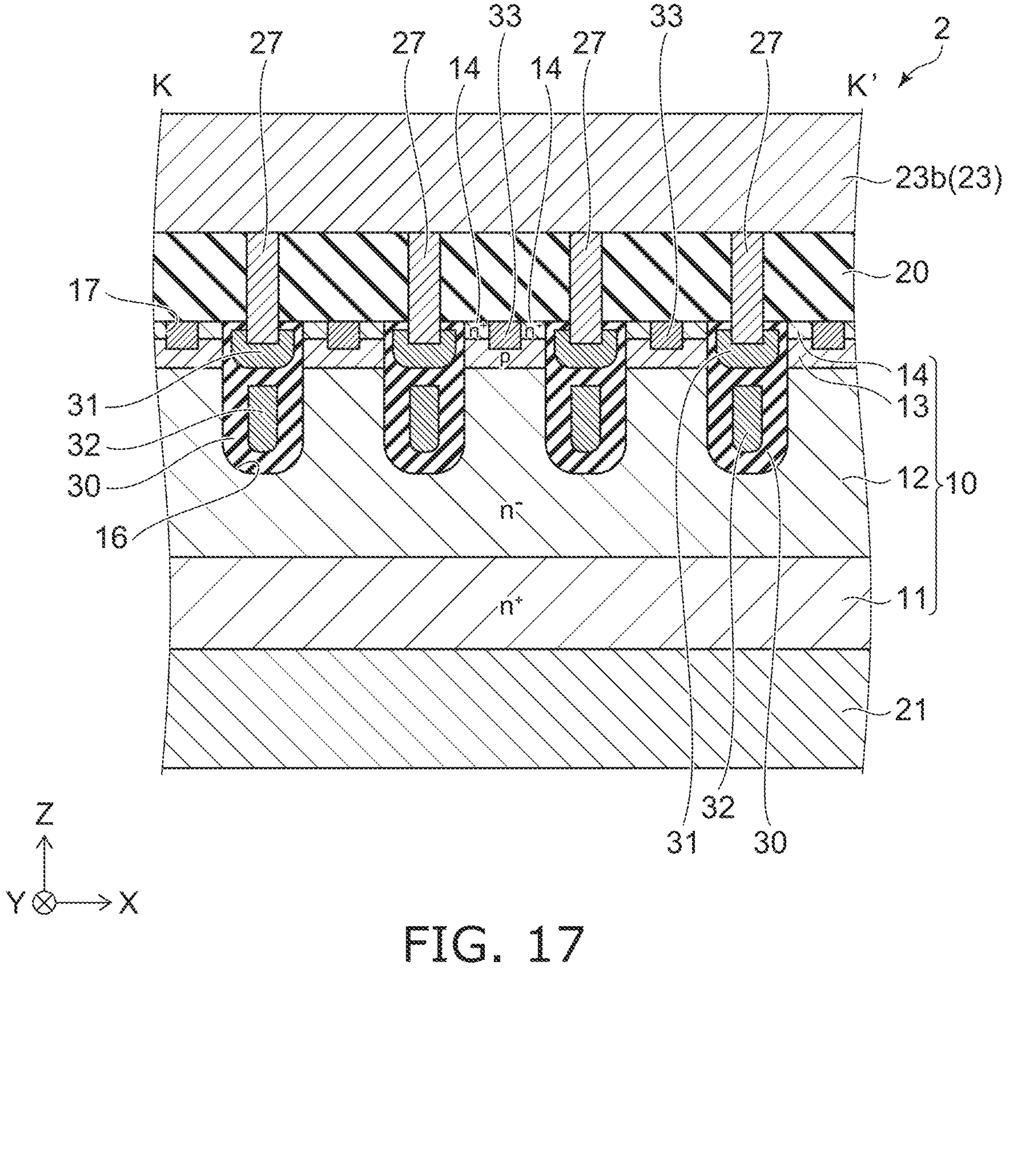
FIG. 17 is a cross-sectional view along line K-K' shown in FIG. 16.

FIG. 17 is a cross-sectional view along line K-K' shown in FIG. 16.

Figure 18:
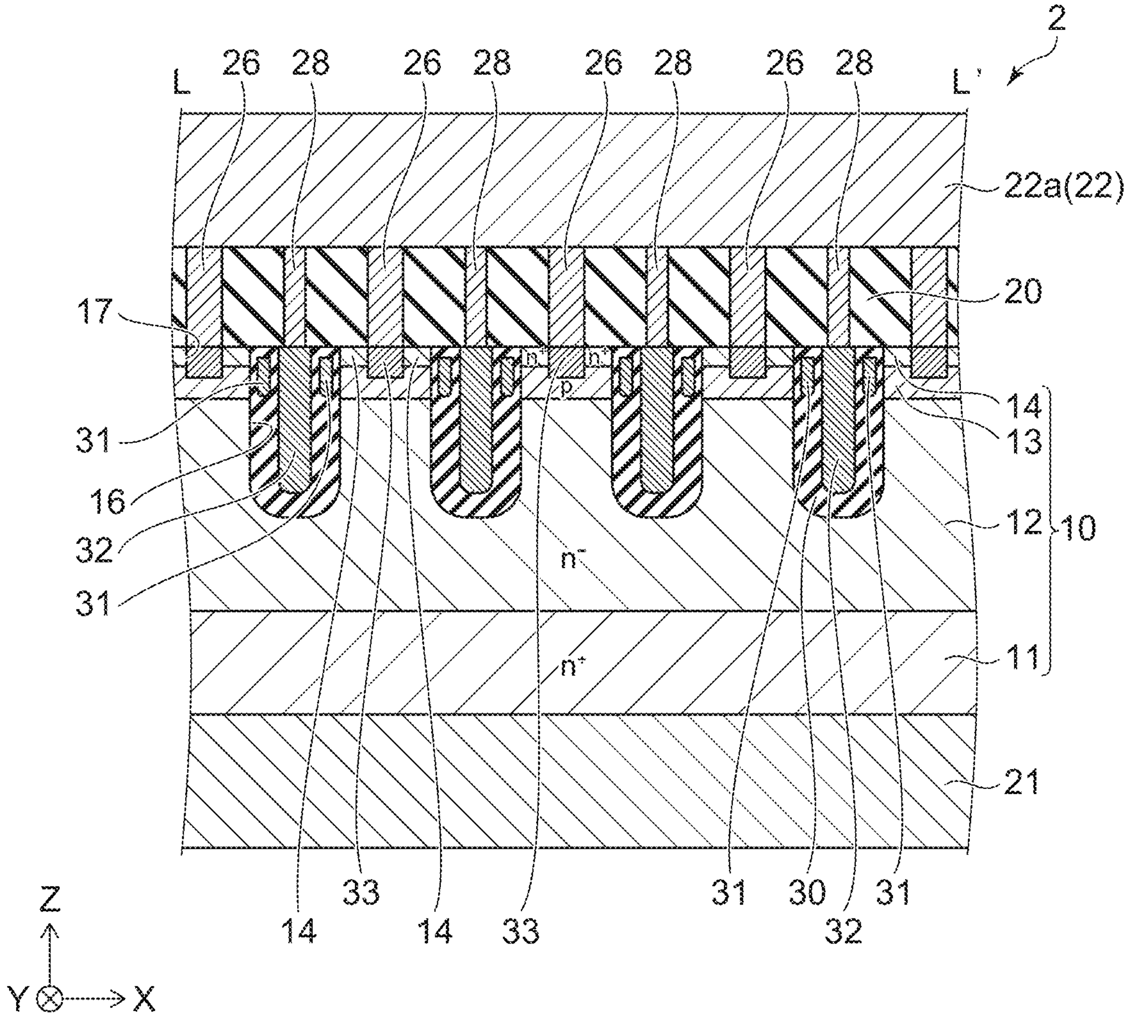
FIG. 18 is a cross-sectional view along line L-L' shown in FIG. 16.

FIG. 18 is a cross-sectional view along line L-L' shown in FIG. 16.

Figure 19:
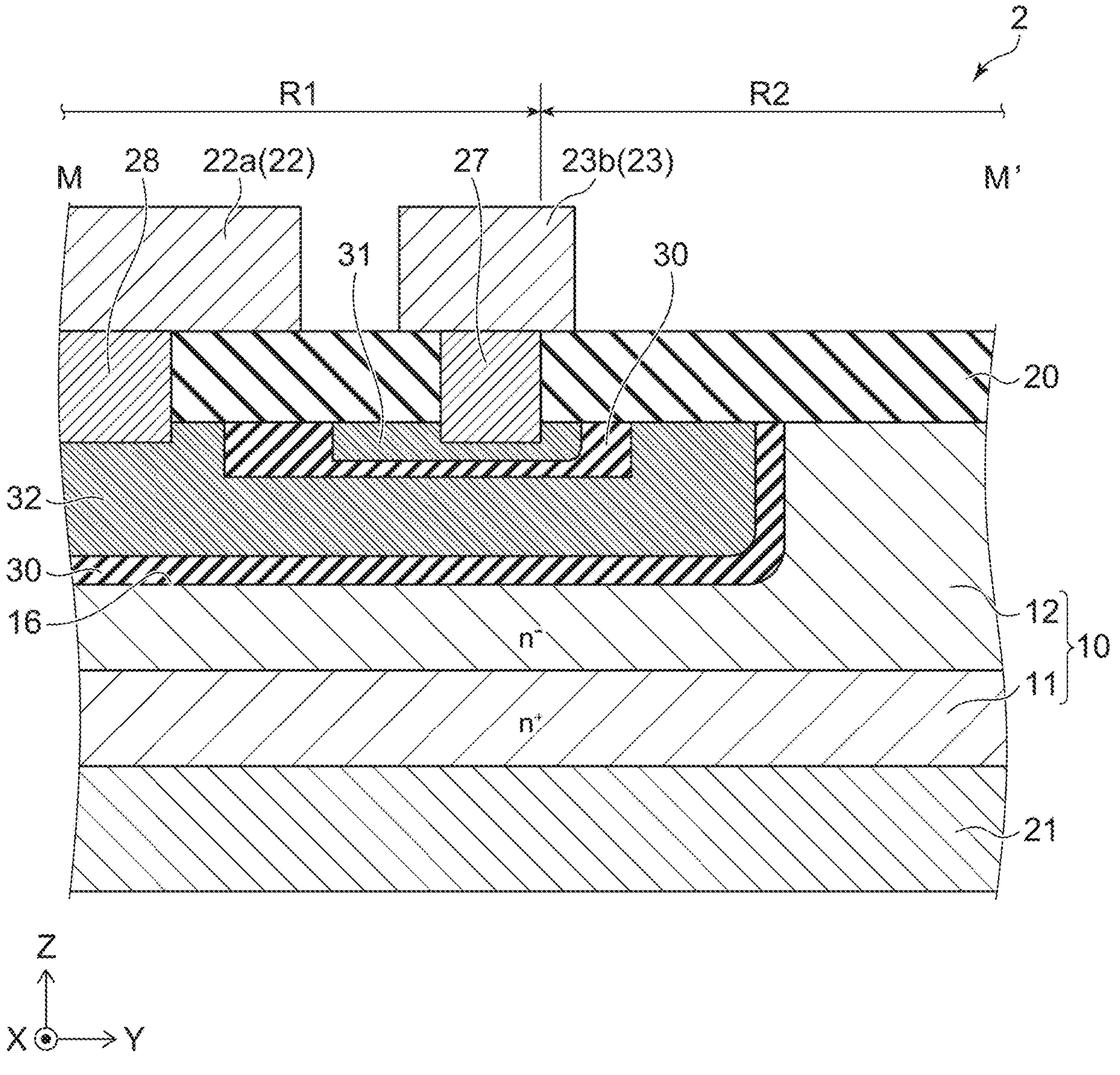
FIG. 19 is a cross-sectional view along line M-M' shown in FIG. 16.

FIG. 19 is a cross-sectional view along line M-M' shown in FIG. 16.

In the semiconductor device 2 according to the embodiment as shown in FIG. 15, the source electrode 22 does not include the wiring parts 22*b* to 22*d* (see FIG. 1A). As shown in FIGS. 16 to 19, the trench gate electrode 31 that is located in each insulating body 30 has one stripe shape in the region directly under the gate electrode 23 similarly to the first embodiment, but branches into two in the region directly under the source electrode 22. The FP electrode 32 is drawn out to the upper surface of the semiconductor part 10 between the two branched parts of the gate electrode 23. The FP contact 28 is connected between the source electrode 22 and the part of the FP electrode 32 drawn out to the upper surface of the semiconductor part 10.

The FP electrode 32 is thereby connected to the source electrode 22 via the FP contact 28. For example, the FP contact 28 is located at the same position as the source contact 26 in the Y-direction. In other words, the FP contact 28 and the source contact 26 are alternately arranged along the X-direction. The position of the FP contact 28 may be shifted from the position of the source contact 26 in the Y-direction.

According to the embodiment, the FP electrode 32 is drawn out to the upper surface of the semiconductor part 10 at a position further toward the termination part side than the trench gate electrode 31. The concentration of the electric flux at the termination part of the semiconductor device 2 can be relaxed thereby. However, the FP contact 28 is not provided at this part because the source electrode 22 is not provided in the region directly above this part.

The source layer 14 extends to the end portion vicinity of the trench gate electrode 31 in the Y-direction. The trench source electrode 33 extends further toward the termination part of the semiconductor device 2 along the Y-direction than the region directly under the source electrode 22; and the Y-direction end portion of the trench source electrode 33 is located in the region directly under the gate electrode 23. For example, the end portion of the trench source electrode 33 is at substantially the same position as the end portion of the trench gate electrode 31 in the Y-direction.

Therefore, the source potential can be applied to the entire source layer 14 via the trench source electrode 33. As a result, the effective region R1 can be enlarged to the end portion vicinity of the gate electrode 31 in the Y-direction. Otherwise, the configuration, operations, and effects according to the embodiment are similar to those of the first embodiment.

Third Embodiment

A third embodiment will now be described.

Figure 20:
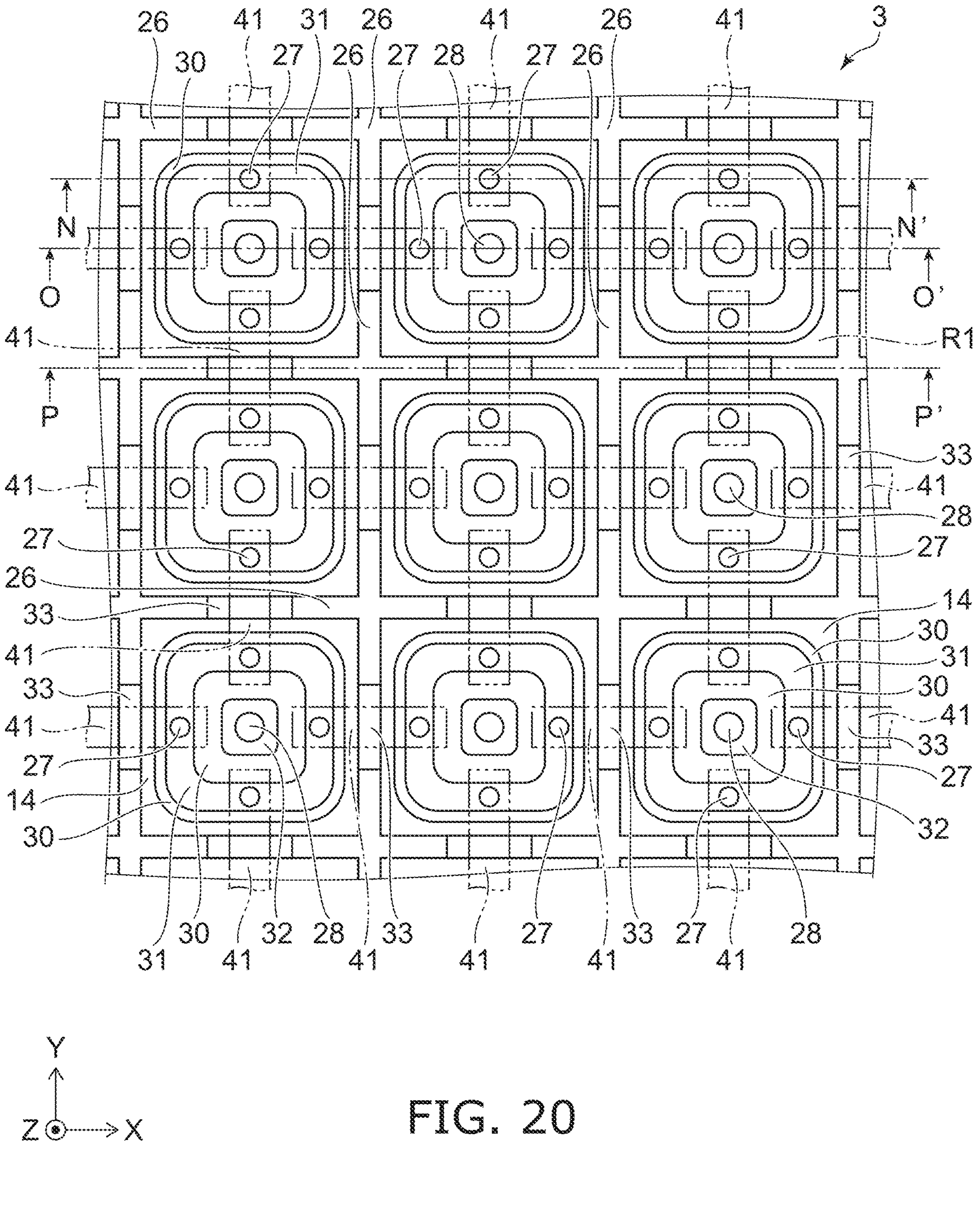
FIG. 20 is a partially enlarged top view showing a semiconductor device according to a third embodiment.

FIG. 20 is a partially enlarged top view showing a semiconductor device according to the embodiment.

Figure 21:
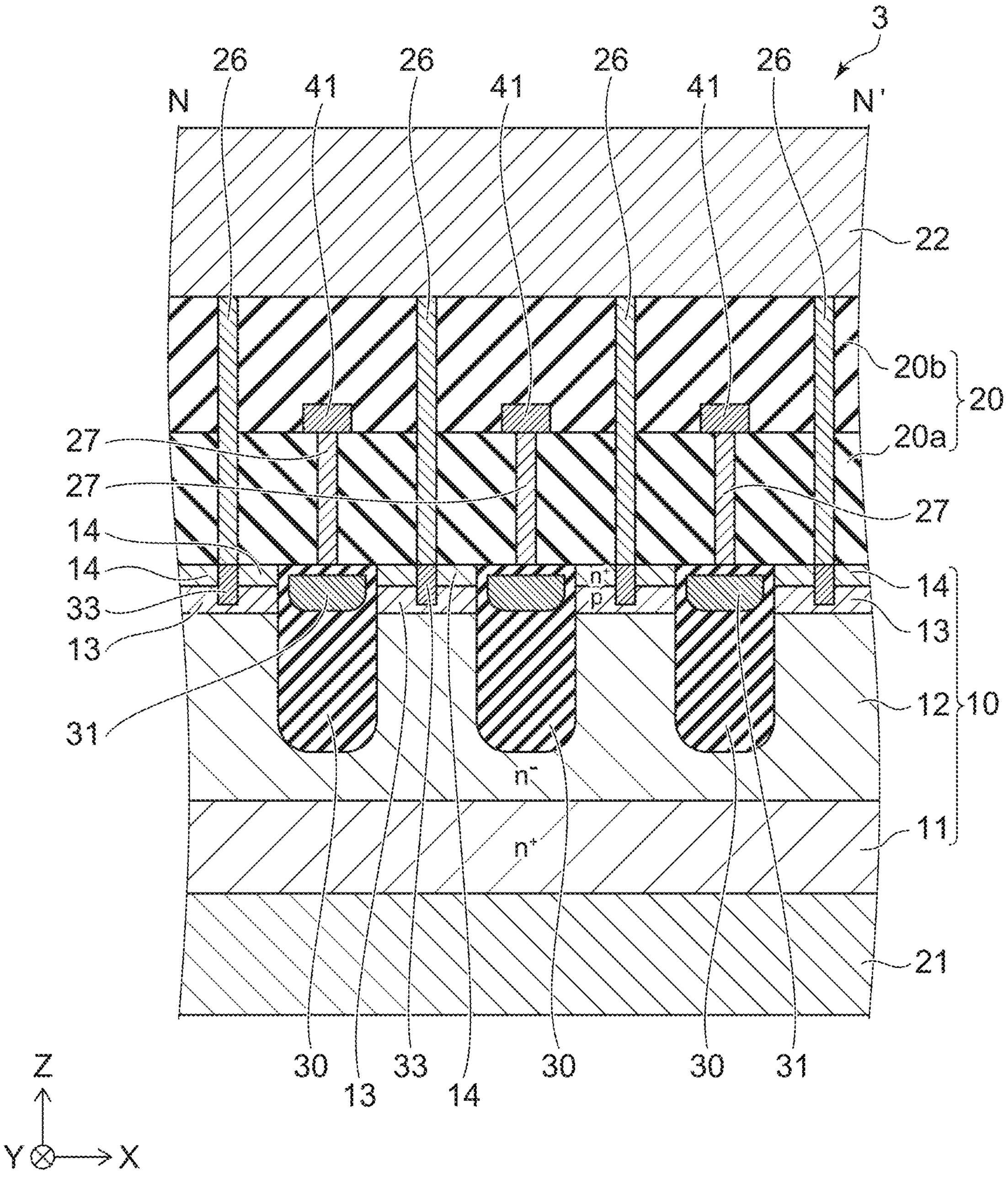
FIG. 21 is a cross-sectional view along line N-N' shown in FIG. 20.

FIG. 21 is a cross-sectional view along line N-N' shown in FIG. 20.

Figure 22:
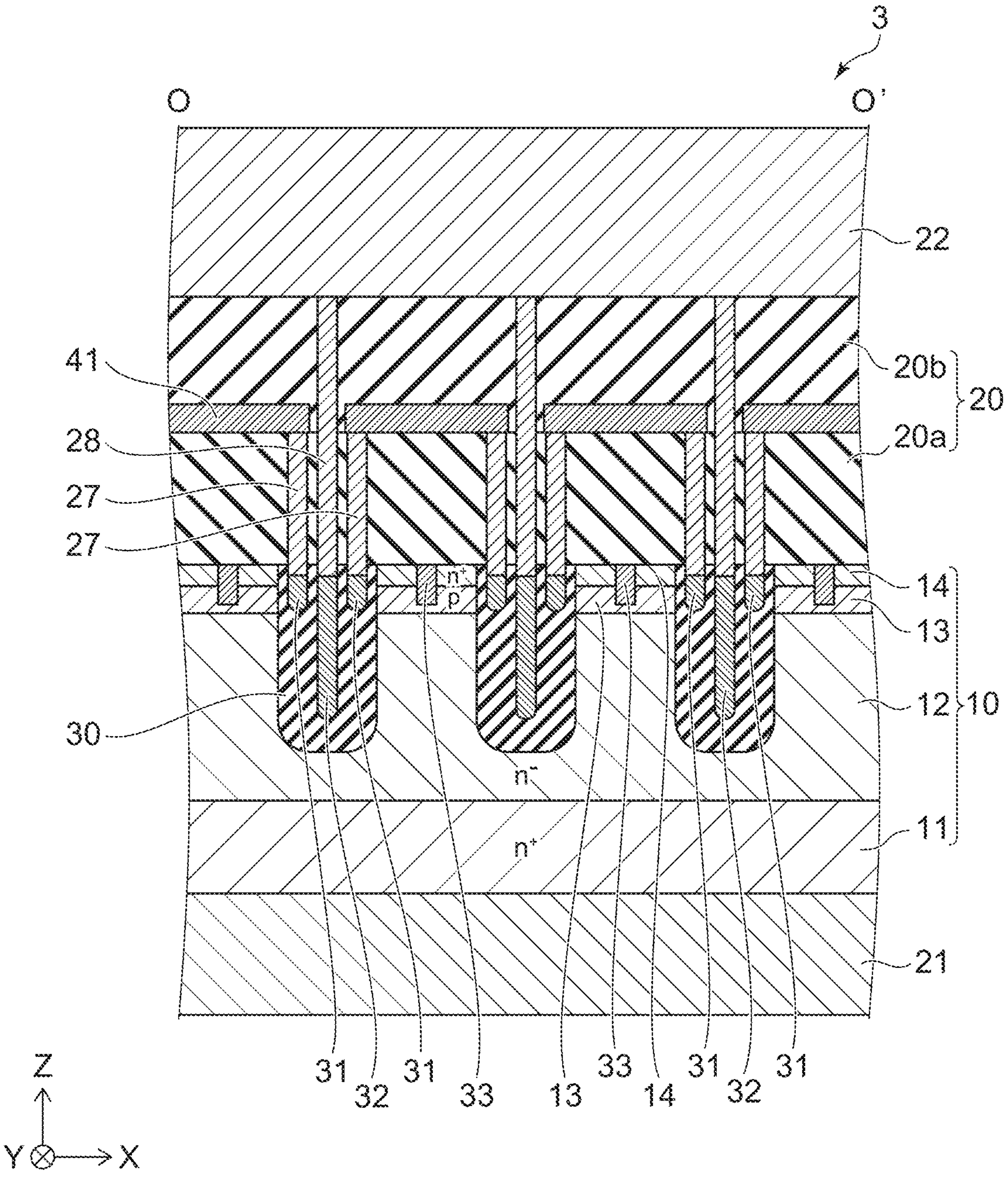
FIG. 22 is a cross-sectional view along line O-O' shown in FIG. 20.

FIG. 22 is a cross-sectional view along line O-O' shown in FIG. 20.

Figure 23:
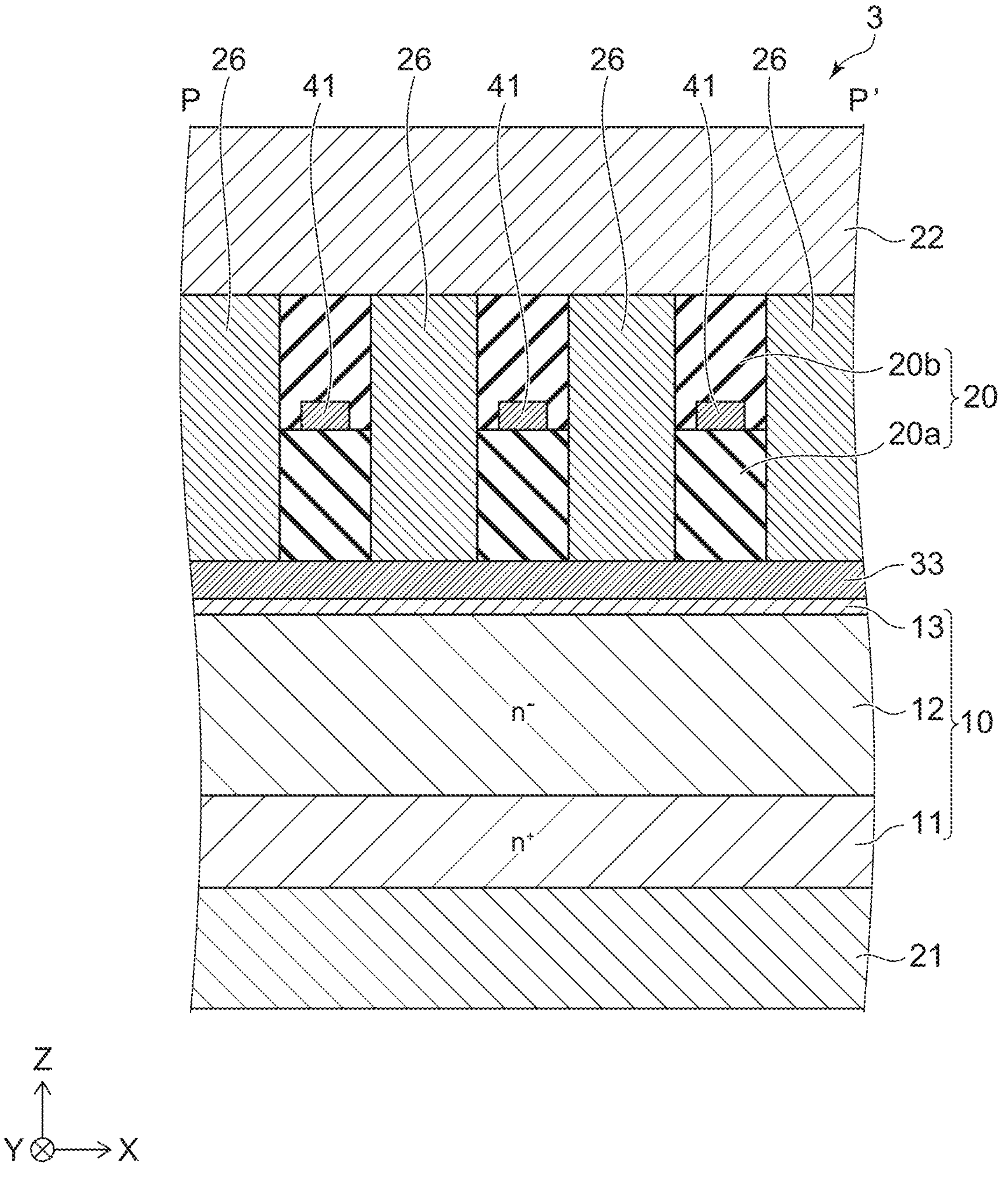
FIG. 23 is a cross-sectional view along line P-P' shown in FIG. 20.

FIG. 23 is a cross-sectional view along line P-P' shown in FIG. 20.

The source electrode 22 is not illustrated in FIG. 20. A gate wiring part 41 is illustrated by a double dot-dash line.

In the semiconductor device 3 according to the embodiment as shown in FIGS. 20 to 23, the drain electrode 21, the semiconductor part 10, the insulating film 20, and the source electrode 22 are stacked in this order upward from below. A lower layer 20*a* and an upper layer 20*b* are stacked in the insulating film 20.

The multiple insulating bodies 30 are located in the semiconductor part 10. The multiple insulating bodies 30 are arranged in a matrix configuration along the X-direction and the Y-direction. Each insulating body 30 has a columnar shape extending in the Z-direction. The upper surface of the insulating body 30 is exposed at the upper surface of the semiconductor part 10.

One trench gate electrode 31 and one FP electrode 32 are located in each insulating body 30. The FP electrode 32 has a columnar shape extending in the Z-direction. The FP electrode 32 is located at the central axis vicinity of the insulating body 30 when viewed from the +Z direction. For example, the trench gate electrode 31 has a rectangular tubular configuration extending in the Z-direction. The trench gate electrode 31 surrounds the FP electrode 32 when viewed from the +Z direction. The FP electrode 32 is longer than the trench gate electrode 31 in the Z-direction. The position of the upper end of the FP electrode 32 is substantially the same as the position of the upper end of the trench gate electrode 31; and the position of the lower end of the FP electrode 32 is lower than the position of the lower end of the trench gate electrode 31.

The trench source electrode 33 is located in the semiconductor part 10. The trench source electrode 33 has a lattice shape when viewed along the Z-direction and surrounds the insulating bodies 30. Therefore, the trench source electrode 33 is located between two adjacent insulating bodies 30 in the semiconductor part 10.

The source contact 26, the gate contact 27, and the FP contact 28 are located in the insulating film 20. The source contact 26 extends in the Z-direction. The source contact 26 has a cross shaped when viewed along the Z-direction. The source contact 26 is located at each crossing portion between the part of the trench source electrode 33 having the lattice shape extending in the X-direction and the part of the trench source electrode 33 extending in the Y-direction. The upper end of the source contact 26 is connected to the source electrode 22; and the lower end of the source contact 26 is connected to the trench source electrode 33. Accordingly, the trench source electrode 33 is connected to the source electrode 22 via the source contact 26.

The semiconductor device 3 includes the multiple gate wiring parts 41 (first wiring parts). The gate wiring part 41 is located on the lower layer 20a of the insulating film 20 and is covered with the upper layer 20b. In other words, the gate wiring part 41 is located in the insulating film 20. The gate wiring part 41 is connected to the gate electrode 23 (not illustrated) located on the insulating film 20.

The gate contact 27 has a columnar shape extending in the Z-direction. The upper end of the gate contact 27 is connected to the gate wiring part 41; and the lower end of the gate contact 27 is connected to the trench gate electrode 31. Accordingly, the trench gate electrode 31 is connected to the gate wiring part 41 via the gate contact 27.

As described above, the trench gate electrode 31 has a rectangular tubular configuration; and four gate contacts 27 are connected to one trench gate electrode 31. In other words, the trench gate electrode 31 has a rectangular frame shape when viewed along the Z-direction; and one gate contact 27 is connected to each of the side portion at the +X direction side, the side portion at the −X direction side, the side portion at the +Y direction side, and the side portion at the −Y direction side of the trench gate electrode 31.

The gate wiring parts 41 include the gate wiring part 41 that extends in the X-direction, and the gate wiring part 41 that extends in the Y-direction. The gate wiring part 41 that extends in the X-direction is connected to the gate contacts 27 adjacent to each other in the X-direction and passes between the source contacts 26 adjacent to each other in the Y-direction. The gate wiring part 41 that extends in the Y-direction is connected to the gate contacts 27 adjacent to each other in the Y-direction and passes between the source contacts 26 adjacent to each other in the X-direction. Therefore, a portion of the trench source electrode 33 overlaps a portion of the gate wiring part 41 when viewed from the +Z direction.

The four gate contacts 27 that are connected to one trench gate electrode 31 are connected to four mutually-different gate wiring parts 41. Accordingly, the trench gate electrode 31 that is located in one insulating body 30 is connected via mutually-different gate wiring parts 41 to four trench gate electrodes 31 located in four insulating bodies 30 adjacent at the +X direction side, the −X direction side, the +Y direction side, and the −Y direction side. As a result, all of the trench gate electrodes 31 provided in the semiconductor device 2 are connected to each other via the gate contacts 27 and the gate wiring parts 41. As a result, all of the trench gate electrodes 31 are connected to the gate electrode 23 (not illustrated).

The FP contact 28 has a columnar shape extending in the Z-direction. The upper end of the FP contact 28 is connected to the source electrode 22; and the lower end of the FP contact 28 is connected to the FP electrode 32. The FP electrode 32 is thereby connected to the source electrode 22 via the FP contact 28.

The configuration of the semiconductor part 10 is similar to that of the first embodiment. In other words, the semiconductor part 10 includes the $n^+$-type drain layer 11 that contacts the drain electrode 21, the $n^-$-type drift layer 12 that is located on the drain layer 11 and contacts the drain layer 11, the p-type base layer 13 that is located on a portion of the drift layer 12 and contacts the drift layer 12, and the source layer 14 that is located on a portion of the base layer 13 and contacts the base layer 13. The trench source electrode 33 is separated from the drain layer 11 and the drift layer 12 and contacts the base layer 13 and the source layer 14. The source electrode 22 is thereby connected to the base layer 13 and the source layer 14 via the source contact 26 and the trench source electrode 33.

Effects of the embodiment will now be described.

According to the embodiment as well, the ineffective region R2 can be reduced by including the trench source electrode 33. The entire region shown in FIG. 20 is the effective region R1; and the ineffective region R2 does not exist.

Otherwise, the configuration and effects according to the embodiment are similar to those of the first embodiment.

Comparative Example of Third Embodiment

A comparative example of the third embodiment will now be described.

Figure 24:
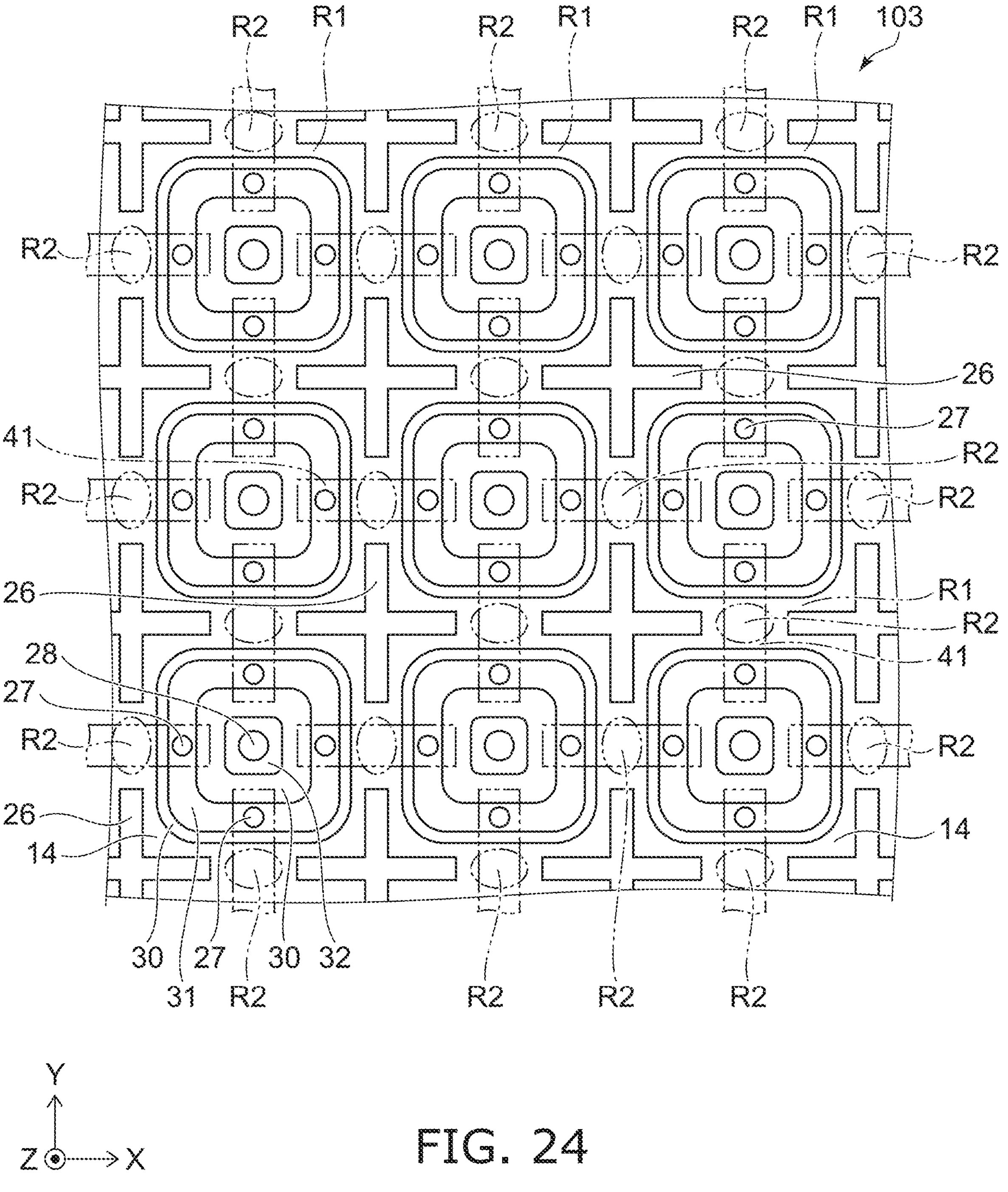
FIG. 24 is a partially enlarged top view showing a semiconductor device according to a comparative example of the third embodiment.

FIG. 24 is a partially enlarged top view showing a semiconductor device according to the comparative example.

As shown in FIG. 24, the semiconductor device 103 according to the comparative example differs from the semiconductor device 3 according to the third embodiment in that the trench source electrode 33 is not included. Therefore, in the semiconductor device 103, the ineffective region R2 occurs between the adjacent source contacts 26 when viewed along the Z-direction. As a result, the on-resistance of the semiconductor device 103 is high. The source layer 14 may not be provided in the ineffective region R2.

According to the embodiments described above, a semiconductor device can be realized in which the on-resistance can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Embodiments include the following aspects.

Note 1

A semiconductor device, comprising:

a first electrode;

a semiconductor part located on the first electrode;

an insulating film located on the semiconductor part;

a second electrode located on the insulating film;

a third electrode located on the insulating film;

an insulating body located in the semiconductor part, the insulating body extending in a first direction;

a first conductive member located in the semiconductor part with the insulating body interposed, the first conductive member extending in the first direction, the first conductive member being connected to the third electrode;

a second conductive member located in the insulating body, the second conductive member extending in the first direction, the second conductive member being connected to the second electrode; and a third conductive member located in the semiconductor part, the third conductive member extending in the first direction from a region directly under the second electrode to at least a region directly under the third electrode, the third conductive member being connected to the semiconductor part and the second electrode.

Note 2

The device according to note 1, wherein the third conductive member includes a metal.

Note 3

The device according to note 1 or 2, wherein the semiconductor part includes:

a first layer connected to the first electrode, the first layer being of a first conductivity type;

a second layer located on a portion of the first layer, the second layer being of a second conductivity type; and a third layer located on a portion of the second layer, the third layer being of the first conductivity type, and the third conductive member is separated from the first layer and contacts the third layer.

Note 4

The device according to any one of notes 1-3, wherein the second electrode includes:

a first part; and a second part, the first direction is a direction from the first part toward the second part, at least a portion of the third electrode is located between the first part and the second part, the second conductive member is connected to the second part, and the third conductive member is connected to the first part.

Note 5

The device according to any one of notes 1-3, wherein the first conductive member is divided into two parts in a region directly under the second electrode, and the second conductive member is connected to the second electrode by being drawn out to an upper surface of the semiconductor part between the two parts.

Note 6

A semiconductor device, comprising:

a first electrode;

a semiconductor part located on the first electrode;

an insulating film located on the semiconductor part;

a second electrode located on the insulating film, the second electrode including a first part and a second part;

a third electrode located on the insulating film, at least a portion of the third electrode being located between the first part and the second part;

an insulating body located in the semiconductor part, the insulating body extending in a first direction, the first direction being from the first part toward the second part;

a first conductive member located in the insulating body, the first conductive member extending in the first direction, the first conductive member being connected to the third electrode;

a second conductive member located in the insulating body, the second conductive member extending in the first direction, the second conductive member being connected to the second part; and a third conductive member located in the semiconductor part, the third conductive member extending in the first direction, the third conductive member being connected to the semiconductor part and the first part.

Note 7

The device according to note 6, further comprising:

a first contact located in the insulating film, the first contact being connected to the first part and the third conductive member;

a second contact located in the insulating film, the second contact being connected to the third electrode and the first conductive member; and a third contact located in the insulating film, the third contact being connected to the second part and the second conductive member, the second contact being positioned between the first contact and the third contact in the first direction.

Note 8

The device according to note 6 or 7, wherein the third conductive member includes a metal.

Note 9

The device according to any one of notes 6-8, wherein the semiconductor part includes:

a first layer connected to the first electrode, the first layer being of a first conductivity type;

a second layer located on a portion of the first layer, the second layer being of a second conductivity type; and a third layer located on a portion of the second layer, the third layer being of the first conductivity type, and the third conductive member is separated from the first layer and contacts the third layer.

Note 10

The device according to note 9, wherein the third conductive member also contacts the second layer.

Note 11

The device according to note 9 or 10, wherein in the first direction, a distance between the second part and the third conductive member is less than a distance between the second part and the third layer.

Note 12

The device according to any one of notes 6-11, wherein the second conductive member is positioned between the first electrode and the first conductive member.

Note 13

A semiconductor device, comprising:

a first electrode;

a semiconductor part located on the first electrode;

an insulating film located on the semiconductor part;

a second electrode located on the insulating film;

a plurality of insulating bodies located in the semiconductor part;

first conductive members located respectively in the plurality of insulating bodies;

second conductive members located respectively in the plurality of insulating bodies, the second conductive members being connected to the second electrode;

a third conductive member located between two adjacent insulating bodies among the plurality of insulating bodies in the semiconductor part, the third conductive member being connected to the semiconductor part and the second electrode; and a first wiring part located in the insulating film, the first wiring part being connected to two of the first conductive members located in two adjacent insulating bodies among the plurality of insulating bodies.

Note 14

The device according to note 13, further comprising:

a first contact located in the insulating film, the first contact being connected to the second electrode and the third conductive member;

a second contact located in the insulating film, the second contact being connected to the first wiring part and the first conductive member; and a third contact located in the insulating film, the third contact being connected to the second electrode and the second conductive member.

Note 15

The device according to note 13 or 14, wherein a portion of the first wiring part overlaps a portion of the third conductive member when viewed along a first direction, and the first direction is from the first electrode toward the second electrode.

Note 16

The device according to any one of notes 13-15, wherein the first conductive member surrounds the second conductive member when viewed along a first direction, and the first direction is from the first electrode toward the second electrode.

Note 17

The device according to any one of notes 13-16, wherein the plurality of insulating bodies is arranged along a second direction and a third direction, the second direction and the third direction cross each other and are orthogonal to a first direction, the first direction is from the first electrode toward the second electrode, and the third conductive member has a lattice shape surrounding each of the plurality of insulating bodies when viewed along the first direction.

Note 18

The device according to any one of notes 13-17, wherein the semiconductor part includes:

a first layer connected to the first electrode, the first layer being of a first conductivity type;

a second layer located on a portion of the first layer, the second layer being of a second conductivity type; and a third layer located on a portion of the second layer, the third layer being connected to the second electrode, the third layer being of the first conductivity type, and the third conductive member is separated from the first layer and contacts the third layer.

Note 19

The device according to note 18, wherein the third conductive member also contacts the second layer.

What is claimed is:

1. A semiconductor device, comprising:

a first electrode;

a semiconductor part located on the first electrode;

an insulating film located on the semiconductor part;

a second electrode located on the insulating film;

a third electrode located on the insulating film;

an insulating body located in the semiconductor part, the insulating body extending in a first direction;

a first conductive member located in the semiconductor part with the insulating body interposed, the first conductive member extending in the first direction, the first conductive member being connected to the third electrode;

a second conductive member located in the insulating body, the second conductive member extending in the first direction, the second conductive member being connected to the second electrode; and a third conductive member located in the semiconductor part, the third conductive member extending in the first direction from a region directly under the second electrode to at least a region directly under the third electrode, the third conductive member being connected to the semiconductor part and the second electrode.

2. The device according to claim 1, wherein the third conductive member includes a metal.

3. The device according to claim 1, wherein the semiconductor part includes:

a first layer connected to the first electrode, the first layer being of a first conductivity type;

a second layer located on a portion of the first layer, the second layer being of a second conductivity type; and a third layer located on a portion of the second layer, the third layer being of the first conductivity type, and the third conductive member is separated from the first layer and contacts the third layer.

4. The device according to claim 1, wherein the second electrode includes:

a first part; and a second part, the first direction is a direction from the first part toward the second part, at least a portion of the third electrode is located between the first part and the second part, the second conductive member is connected to the second part, and the third conductive member is connected to the first part.

5. The device according to claim 1, wherein the first conductive member is divided into two parts in a region directly under the second electrode, and the second conductive member is connected to the second electrode by being drawn out to an upper surface of the semiconductor part between the two parts.

6. A semiconductor device, comprising:

a first electrode;

a semiconductor part located on the first electrode;

an insulating film located on the semiconductor part;

a second electrode located on the insulating film, the second electrode including a first part and a second part;

a third electrode located on the insulating film, at least a portion of the third electrode being located between the first part and the second part;

an insulating body located in the semiconductor part, the insulating body extending in a first direction, the first direction being from the first part toward the second part;

a first conductive member located in the insulating body, the first conductive member extending in the first direction, the first conductive member being connected to the third electrode;

a second conductive member located in the insulating body, the second conductive member extending in the first direction, the second conductive member being connected to the second part; and a third conductive member located in the semiconductor part, the third conductive member extending in the first direction, the third conductive member being connected to the semiconductor part and the first part.

7. The device according to claim 6, further comprising:

a first contact located in the insulating film, the first contact being connected to the first part and the third conductive member;

a second contact located in the insulating film, the second contact being connected to the third electrode and the first conductive member; and a third contact located in the insulating film, the third contact being connected to the second part and the second conductive member, the second contact being positioned between the first contact and the third contact in the first direction.

8. The device according to claim 6, wherein the third conductive member includes a metal.

9. The device according to claim 6, wherein the semiconductor part includes:

a first layer connected to the first electrode, the first layer being of a first conductivity type;

a second layer located on a portion of the first layer, the second layer being of a second conductivity type; and a third layer located on a portion of the second layer, the third layer being of the first conductivity type, and the third conductive member is separated from the first layer and contacts the third layer.

10. The device according to claim 9, wherein the third conductive member also contacts the second layer.

11. The device according to claim 9, wherein in the first direction, a distance between the second part and the third conductive member is less than a distance between the second part and the third layer.

12. The device according to claim 6, wherein the second conductive member is positioned between the first electrode and the first conductive member.

* * * * *